United States Patent
Ito et al.

(10) Patent No.: US 8,627,170 B2
(45) Date of Patent: *Jan. 7, 2014

(54) CYCLIC REDUNDANCY CHECK CIRCUIT AND SEMICONDUCTOR DEVICE HAVING THE CYCLIC REDUNDANCY CHECK CIRCUIT

(75) Inventors: Masafumi Ito, Kanagawa (JP); Tomoaki Atsumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 235 days.

This patent is subject to a terminal disclaimer.

(21) Appl. No.: 12/768,217

(22) Filed: Apr. 27, 2010

(65) Prior Publication Data

US 2010/0205519 A1    Aug. 12, 2010

Related U.S. Application Data

(63) Continuation of application No. 11/533,169, filed on Sep. 19, 2006, now Pat. No. 7,712,009.

(30) Foreign Application Priority Data

Sep. 21, 2005    (JP) .................................. 2005-273356

(51) Int. Cl.
*H03M 13/00*    (2006.01)

(52) U.S. Cl.
USPC .......................................... 714/758; 702/189

(58) Field of Classification Search
USPC .................. 714/758, 800, 801, 802, 803, 804; 702/189

See application file for complete search history.

(56) References Cited

U.S. PATENT DOCUMENTS

| | | | |
|---|---|---|---|
| 4,713,605 A | 12/1987 | Iyer et al. | |
| 4,771,429 A | 9/1988 | Davis et al. | |
| 5,062,111 A | 10/1991 | Gotou et al. | |
| 5,132,975 A * | 7/1992 | Avaneas | 714/757 |
| 5,731,856 A | 3/1998 | Kim et al. | |
| 5,734,663 A | 3/1998 | Eggenberger | |
| 5,744,864 A | 4/1998 | Cillessen et al. | |

(Continued)

FOREIGN PATENT DOCUMENTS

| EP | 0 836 284 A1 | 4/1998 |
|---|---|---|
| EP | 1087534 A1 | 3/2001 |

(Continued)

OTHER PUBLICATIONS

European Search Report (Application No. 06798282.7), dated Dec. 21, 2011, in English.

(Continued)

*Primary Examiner* — Guy Lamarre

(74) *Attorney, Agent, or Firm* — Fish & Richardson P.C.

(57) ABSTRACT

An object of the present invention is to provide a CRC circuit with more simple structure and low power consumption. The CRC circuit includes a first shift register to a p-th shift register, a first EXOR to a (p−1)th EXOR, and a switching circuit. A data signal, a select signal, and an output of a last stage of the p-th shift register are inputted to the switching circuit, and the switching circuit switches a first signal or a second signal in response to the select signal to be outputted.

9 Claims, 26 Drawing Sheets

(56) References Cited

U.S. PATENT DOCUMENTS

| | | |
|---|---|---|
| 6,041,434 A | 3/2000 | Kamishima |
| 6,049,903 A | 4/2000 | Nishimura |
| 6,294,274 B1 | 9/2001 | Kawazoe et al. |
| 6,425,106 B1 | 7/2002 | Higginson et al. |
| 6,560,746 B1 | 5/2003 | Mörsberger |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,428,693 B2 | 9/2008 | Obuchi et al. |
| 7,571,370 B2 | 8/2009 | Ridgeway et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0097432 A1 | 5/2005 | Obuchi et al. |
| 2005/0199959 A1 | 9/2005 | Chiang et al. |
| 2005/0229075 A1 | 10/2005 | Berkmann et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |

FOREIGN PATENT DOCUMENTS

| | | |
|---|---|---|
| EP | 1499024 A1 | 1/2005 |
| JP | 60-198861 A | 10/1985 |
| JP | 63164630 A | 7/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-219725 A | 9/1991 |
| JP | 05-251705 A | 9/1993 |
| JP | 07-326973 A | 12/1995 |
| JP | 08-264794 A | 10/1996 |
| JP | 10107650 A | 4/1998 |
| JP | 10-117147 A | 5/1998 |
| JP | 11-505377 A | 5/1999 |
| JP | 2000-044236 A | 2/2000 |
| JP | 2000-150900 A | 5/2000 |
| JP | 2001331772 A | 11/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| TW | 295640 A | 1/1997 |
| TW | 508907 B | 11/2002 |
| TW | 509840 B | 11/2002 |
| WO | WO0013322 A1 | 3/2000 |
| WO | 0198872 A2 | 12/2001 |
| WO | 2004/114391 A1 | 12/2004 |

OTHER PUBLICATIONS

International Search Report (Application No. PCT/JP2006/318899) dated Dec. 5, 2006, 2 pages.

Written Opinion (Application No. PCT/JP2006/318899) dated Dec. 5, 2006, 3 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26. pp. 181-184.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology,"IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters). Sep. 27, 2004, vol. 85, No. 13, pp. 2541-2543.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Oxygen Vacancies in ZnO," Appl. Phys. Lett. (Applied Physics Letters), 2005, vol. 87, pp. 122102-1-122102-3.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "Polymer-Stabilized Liquid Crystal Blue Phases," Nature Materials, Sep. 1, 2002, vol. 1, pp. 64-68.

Kimizuka, N et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Lee, H et al., "Current Status of, Challenges to, and Perspective View of AM-OLED," IDW '06 : Proceedings of the 13th International Display Workshops, Dec. 7, 2006, pp. 663-666.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Taiwanese Office Action (Application No. 95134850) dated Dec. 26, 2012, with English Translation.

European Office Action (Application No. 06798282.7) dated Sep. 13, 2013, in English.

* cited by examiner

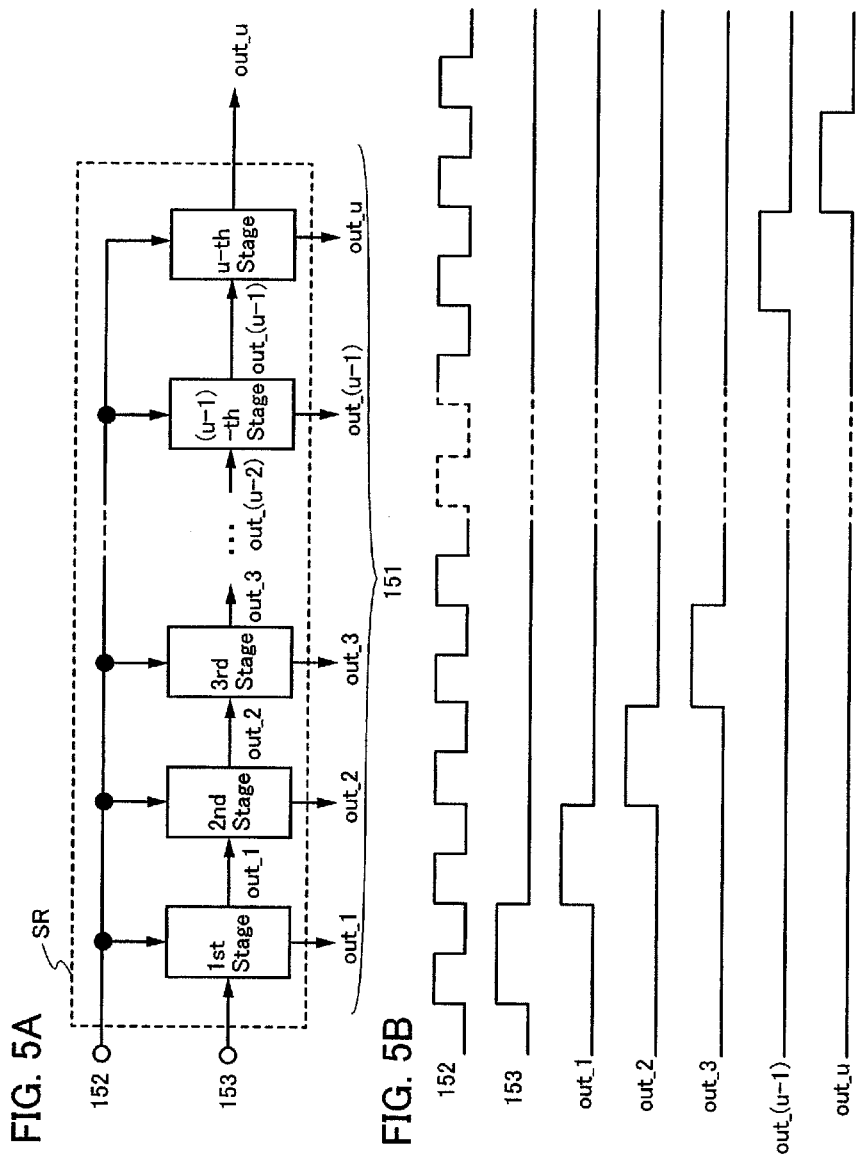

US 8,627,170 B2

CYCLIC REDUNDANCY CHECK CIRCUIT AND SEMICONDUCTOR DEVICE HAVING THE CYCLIC REDUNDANCY CHECK CIRCUIT

CROSS-REFERENCE TO RELATED APPLICATIONS

This application is a continuation of U.S. application Ser. No. 11/533,169, filed Sep. 19, 2006, now U.S. Pat. No. 7,712,009, which claims the benefit of a foreign priority application filed in Japan as Serial No. 2005-273356 on Sep. 21, 2005, both of which are incorporated by reference.

TECHNICAL FIELD

The present invention relates to a cyclic redundancy check circuit, and a semiconductor device having the cyclic redundancy check circuit. The present invention further relates to an electronic apparatus having the semiconductor device, and a wireless communication system using the semiconductor device.

BACKGROUND ART

There is a semiconductor device for transmitting/receiving a data signal by wireless communication such as a wireless tag (also called an IC tag, an IC chip, an RF (Radio Frequency) tag, an RFID (Radio Frequency Identification) tag, an electronic tag, or a transponder). In a device for transmitting/receiving a data signal, cyclic redundancy checking (CRC) is performed for checking whether the data signal is transmitted accurately. In the cyclic redundancy checking, a polynomial (called a code polynomial) in which each bit of a received data signal is set as a coefficient is divided by a predetermined generator polynomial, and a coefficient of a remainder polynomial (hereinafter called a CRC code) is calculated. The CRC code is compared to a predetermined signal so that it is determined whether the received data signal is correct.

As for a circuit for performing cyclic redundancy checking (a cyclic redundancy check circuit), a structure having a plurality of delay elements and a plurality of exclusive OR circuits is proposed (Reference 1: Japanese Patent Application Laid-Open No. Hei 10-107650).

The structure of the cyclic redundancy check circuit is described with reference to FIG. 12. In FIG. 12, a cyclic redundancy check circuit includes delay elements S0 to S15 and exclusive OR circuits EXOR 0 to EXOR 2 which calculate an exclusive OR of two inputted signals.

The delay elements S0 to S4 sequentially output a signal which is shifted, in synchronization with a clock signal 181. That is, the delay elements S0 to S4 form a first shift register (denoted by SR 1 in FIG. 12). The delay elements S5 to S11 sequentially output a signal which is shifted, in synchronization with the clock signal 181. That is, the delay elements S5 to S11 form a second shift register (denoted by SR 2 in FIG. 12). The delay elements S12 to S15 also sequentially output a signal which is shifted, in synchronization with the clock signal 181. That is, the delay elements S12 to S15 form a third shift register (denoted by SR 3 in FIG. 12). An output of the exclusive OR circuit EXOR 0 is inputted to the delay element S0 of the first shift register SR 1. An output of S4 of the first shift register and the output of the exclusive OR circuit EXOR 0 are inputted to the exclusive OR circuit EXOR 1. An output of the exclusive OR circuit EXOR 1 is inputted to S5 of the second shift register. An output of S11 of the second shift register and the output of the exclusive OR circuit EXOR 0 are inputted to the exclusive OR circuit EXOR 2. An output of the exclusive OR circuit EXOR 2 is inputted to S12 of the third shift register. A data signal 182 and an output of S15 of the third shift register are inputted to the exclusive OR circuit EXOR 0.

The cyclic redundancy check circuit having the aforementioned structure calculates a 16-bit CRC code corresponding to the inputted data signal 182, and outputs the CRC code from out_1 to out_16 in parallel.

DISCLOSURE OF INVENTION

In the case of receiving a data signal, a CRC code corresponding to the data signal is calculated, the CRC code is outputted in parallel, and the CRC code is compared to a predetermined signal so that it may be determined whether the received data signal is correct. On the other hand, in the case of transmitting a data signal, it is required that a CRC code corresponding to the data signal be calculated and the CRC code be added to the data signal in serial.

However, in a conventional cyclic redundancy check circuit, a CRC code can be outputted only in parallel, not in serial. This is because, since a signal is changed when a signal is transmitted from a shift register to a next shift register through an exclusive OR circuit, not all of signals stored in respective delay elements of all shift registers can be shifted and outputted.

In the conventional cyclic redundancy check circuit, in order to output the CRC code stored in each delay element of the shift register in serial, a circuit which once holds the CRC codes outputted in parallel and sequentially outputs the CRC codes is required. For example, in addition to a shift register for calculating the CRC code, another shift register or the like is required. Therefore, a structure of the cyclic redundancy check circuit is complicated, which results in a larger circuit. Further, in accordance with the larger circuit, power consumption is increased.

In view of the aforementioned conditions, an object of the present invention is to provide a cyclic redundancy check circuit in which a CRC code corresponding to a data signal can be calculated, the CRC code can be outputted in parallel, and the CRC code can be compared to a predetermined signal in the case of receiving the data signal, and a CRC code corresponding to a data signal can be calculated, and the CRC code can be sequentially outputted in serial in the case of transmitting the data signal, with more simple structure and low power consumption.

In order to solve the aforementioned problems, the present invention has the following structure.

A cyclic redundancy check circuit includes a first shift register to a p-th (p is a natural number greater than 1) shift register, a first exclusive OR circuit to a (p−1)th exclusive OR circuit, and a switching circuit.

Each of the first to p-th shift registers has one stage or a plurality of stages connected in cascade, and outputs an inputted signal having been delayed in synchronization with a clock signal from each stage. That is, each shift register of the first to p-th shift registers has one stage or a plurality of stages connected in cascade. An inputted signal is delayed and then outputted from the one stage or each stage of the plurality of stages. The output of signal from the one stage or the plurality of stages is performed in synchronization with a clock signal. The first to (p−1)th exclusive OR circuits calculate an exclusive OR of two inputted signals. A data signal, a select signal, and an output of a last stage of the p-th shift register are inputted to the switching circuit, and one of a first signal or a second signal is switched in response to the select signal to be outputted. An output of the switching circuit is inputted to a first stage of the first shift register. An output of a last stage of an r-th (r is a natural number smaller than p) shift register and the output of the switching circuit are inputted to an r-th exclusive OR circuit. An output of the r-th exclusive OR circuit is inputted to a first stage of a (r+1)th shift register.

The first signal is an exclusive OR of the data signal and an output of the last stage of the p-th shift register. The second signal is "0". Here, "0" shows that a digital signal is a logical value of "0". Note that the second signal may be a signal for equalizing an output of the r-th exclusive OR circuit with the output of the last stage of the r-th shift register when the second signal is inputted to the r-th exclusive OR circuit.

In addition, the cyclic redundancy check circuit may include a determination circuit and a first memory circuit. The first to p-th shift registers have a structure including s (s is a natural number equal to or greater than p) second memory circuits for storing a 1-bit signal. Signals stored in the s second memory circuits are inputted to the determination circuit as an s-bit output in parallel. The determination circuit outputs a different signal in response to whether the s-bit output matches a predetermined signal stored in the first memory circuit.

The cyclic redundancy check circuit having the aforementioned structure includes the switching circuit, so that, without adding a new shift register or the like, the cyclic redundancy check circuit can switch between the case where a CRC code corresponding to a data signal is calculated and the CRC code is outputted in parallel, and the case where a CRC code corresponding to a data signal is calculated and the CRC code is outputted sequentially in serial. Accordingly, a cyclic redundancy check circuit with more simple structure and low power consumption can be provided.

Therefore, a semiconductor device using the cyclic redundancy check circuit can be downsized and power consumption thereof can be decreased. Further, an electronic apparatus using the semiconductor device can be downsized and power consumption thereof can be decreased. In particular, in the case where the semiconductor device is a wireless chip, since the chip can be downsized and power consumption thereof can be decreased, the kind of objects to which the chip is provided can be increased and the application scope of a wireless communication system using the chip can be extended.

BRIEF DESCRIPTION OF DRAWINGS

FIGS. 5A and 5B are diagrams showing a structure of Embodiment Mode 1.

BEST MODE FOR CARRYING OUT THE INVENTION

Embodiment Mode

Figure 1:
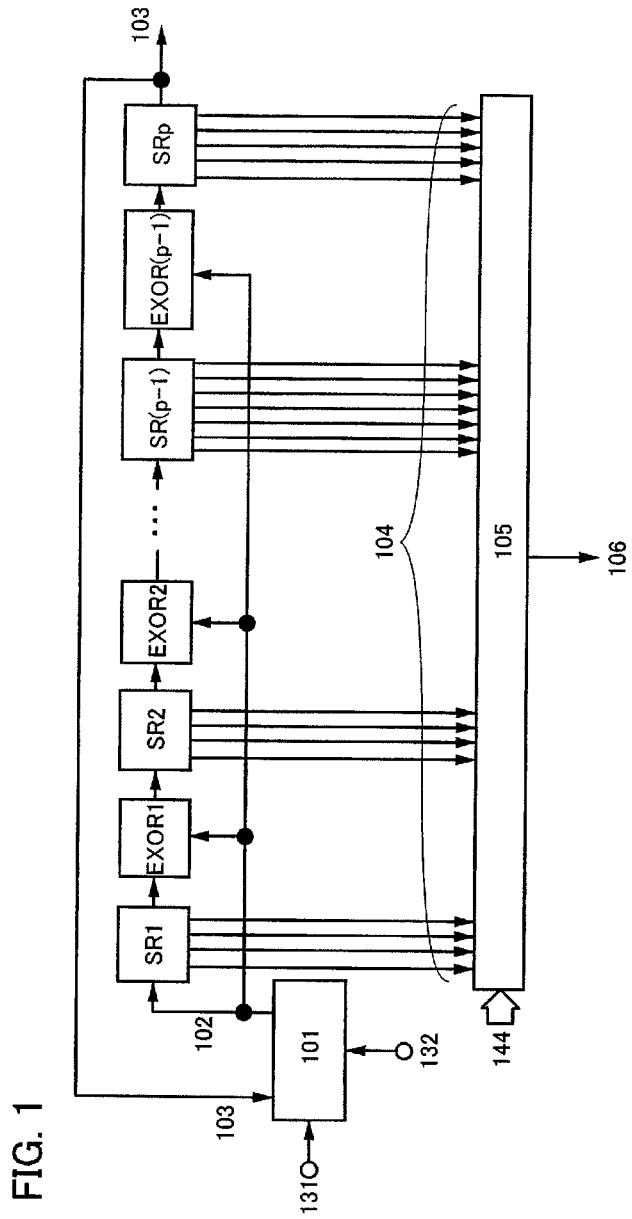
FIG. 1 is a diagram showing a structure of Embodiment Mode 1.

Embodiment modes of the present invention will be described in detail with reference to the drawings. However, the present invention is not limited to the following description, and it is to be easily understood by those skilled in the art that modes and details can be changed variously without departing from the purpose and the scope of the present invention. Therefore, the present invention is not interpreted as being limited to the following description of embodiment modes. In the structure of the present invention described hereinafter, reference numerals and symbols indicating the same things are used in common in the different drawings. In addition, in the present invention, "be connected" is synonymous with "be electrically connected", so that another element or the like may be interposed.

Embodiment Mode 1

In Embodiment Mode 1, a structure of a cyclic redundancy check circuit of the present invention and an operation thereof are described with reference to FIGS. 1 to 3.

FIG. 1 shows a structure of a cyclic redundancy check circuit. The cyclic redundancy check circuit includes a first shift register (denoted by SR 1 in FIG. 1) to a p-th (p is a natural number greater than 1) shift register (denoted by SR p in FIG. 1), a first exclusive OR circuit (denoted by EXOR 1 in FIG. 1) to a (p−1)th exclusive OR circuit (denoted by EXOR (p−1) in FIG. 1), and a switching circuit 101.

Each of the first shift register SR 1 to the p-th shift register SR p has one stage or a plurality of stages connected in cascade, and outputs an inputted signal having been delayed in synchronization with a clock signal from each stage. That is, each shift register of the first shift register SR 1 to p-th shift register SR p has one stage or a plurality of stages connected in cascade. An inputted signal is delayed and then outputted from the one stage or each stage of the plurality of stages. The output of signal from the one stage or the plurality of stages is performed in synchronization with a clock signal.

Here, a structural example of each of the first shift register SR 1 to the p-th shift register SR p is described with reference to FIGS. 5A and 5B. FIG. 5A is a diagram showing a structure of an arbitrary shift register (denoted by SR in FIG. 5A) from among the first shift register SR 1 to the p-th shift register SR p. The shift register SR includes a first stage to a u-th (u is a natural number) stage, and an input signal 153 and a clock signal 152 are inputted to the shift register SR. The input signal 153 is inputted to the first stage, and an output of a preceding stage is inputted to a subsequent stage. Each stage is connected such that an output of a preceding stage is inputted to a subsequent stage, which is called cascade connection. Each of the first stage to the u-th stage can be formed using a delay element including a 1-bit memory circuit. A D-type flip-flop circuit or the like can be used as the delay element.

Note that although FIG. 5A shows the shift register SR including the plurality of stages, a shift register including only one stage may be used. That is, a shift register in which at least one shift register among the first shift register SR 1 to the p-th shift register SR p may be a shift register including only one stage.

FIG. 5B illustrates a timing chart showing a driving method of the shift register having the structure shown in FIG. 5A. As FIG. 5B, the input signal 153 is delayed in synchronization with the clock signal 152 and the shift register SR outputs the delayed input signal sequentially from each stage of the first stage to the u-th stage. In FIGS. 5A and 5B, outputs from respective stages are denoted by out_1 to out_u. The out_1 to the out_u are an output 151 of the shift register SR. In the circuit shown in FIGS. 5A and 5B, in an arbitrary stage, an example in which a signal outputted to the subsequent stage and a signal to be an output of the shift register SR are equal to each other is shown; however, the present invention is not limited to this. In an arbitrary stage, a signal to be the output of the shift register SR may be a signal inverted with respect to a signal to be outputted to the subsequent stage.

FIG. 1 is referred to again. The first exclusive OR circuit EXOR 1 to the (p−1)th exclusive OR circuit EXOR (p−1) calculate an exclusive OR of two inputted signals. A data signal 131, a select signal 132, and an output 103 of the last stage of the p-th shift register SR p are inputted to the switching circuit 101, and one of a first signal or a second signal is switched in response to the select signal 132 to be outputted as an output 102. The output 102 of the switching circuit 101 is inputted to a first stage of the first shift register SR 1. An output of a last stage of an r-th (r is a natural number smaller than p) shift register SR r and the output 102 of the switching circuit 101 are inputted to an r-th exclusive OR circuit EXOR r. An output of the r-th exclusive OR circuit EXOR r, is inputted to a first stage of a (r+1)th shift register SR (r+1).

The first signal is an exclusive OR of the data signal 131 and the output 103 of the last stage of the p-th shift register SR p. The second signal is "0". Here, "0" shows that a digital signal is a logical value of "0". Note that the second signal may be a signal for equalizing the output of the r-th exclusive OR circuit EXOR r with the output of the last stage of the r-th shift register SR r when the second signal is inputted to the r-th exclusive OR circuit EXOR r.

While the first signal is outputted from the output 102 of the switching circuit 101, the cyclic redundancy check circuit outputs an s-bit CRC code in parallel (an s-bit output 104 in FIG. 1). On the other hand, while the second signal is outputted from the output 102 of the switching circuit 101, the first shift register SR 1 to the p-th shift register SR p are operated as one shift register on the whole, and the cyclic redundancy check circuit outputs the s-bit CRC code as the output 103 in serial.

Figure 2:
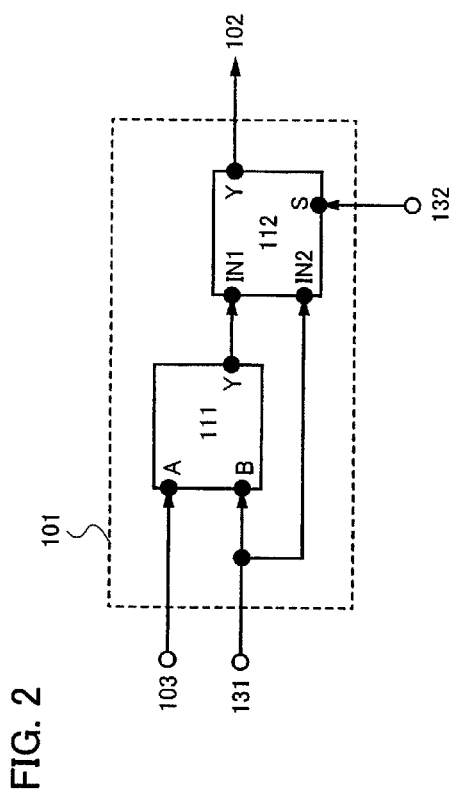
FIG. 2 is a diagram showing a structure of Embodiment Mode 1.

A specific structural example of the switching circuit 101 is shown in FIG. 2. The switching circuit 101 includes an exclusive OR circuit EXOR 111 and a selector 112. The output 103 and the data signal 131 are inputted to the exclusive OR circuit EXOR 111, and an exclusive OR of the output 103 and the data signal 131 is calculated and inputted to the selector 112. The selector 112 switches between an output of the exclusive OR circuit EXOR 111 and the data signal 131 in response to the select signal 132 to be outputted as the output 102.

The data signal 131 and the select signal 132 are described with reference to FIG. 3. Note that FIGS. 1 and 2 are also referred to in the description. In addition, the selector 112 outputs a signal inputted to IN1 from Y when the select signal 132 inputted to S is a logical value of "1", and the selector 112 outputs a signal inputted to IN2 from Y when the select signal 132 is "0".

The data signal 131 is formed of a received data signal, a transmitted data signal, and a "0" signal when there is neither a received data signal nor a transmitted data signal.

Figure 3:
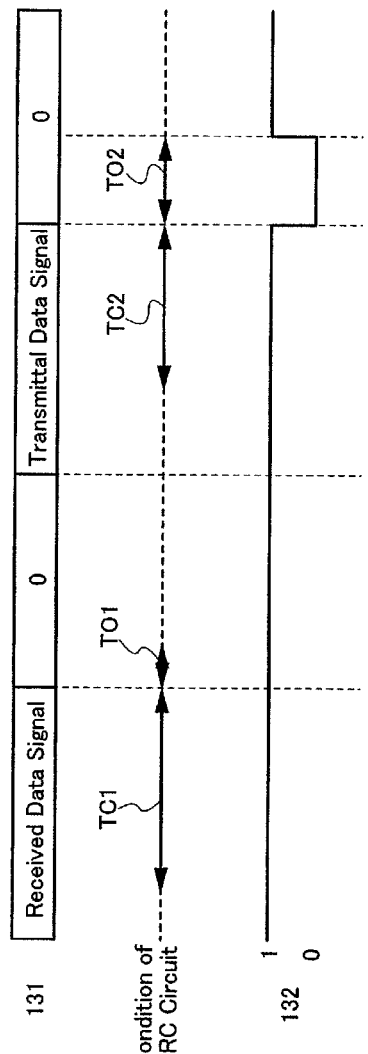
FIG. 3 is a diagram showing a structure of Embodiment Mode 1.

As shown in FIG. 3, after the received data signal in serial is inputted as the data signal 131, the cyclic redundancy check circuit (the CRC circuit) calculates a CRC code corresponding to the received data signal (during a period denoted by TC1 in FIG. 3). When the calculation of the CRC code is terminated, a calculation result, that is, an obtained CRC code is outputted in parallel (during a period denoted by TO1 in FIG. 3). By using the CRC code outputted in parallel, an error of the received data signal is checked. In TC1 and T01, the select signal 132 is "1".

Next, after the transmitted data signal in serial is inputted as the data signal, the cyclic redundancy check circuit (the CRC circuit) calculates a CRC code corresponding to the transmitted data signal (during a period denoted by TC2 in FIG. 3). When the calculation of the CRC code is terminated, a calculation result, that is, an obtained CRC code is outputted in serial (during a period denoted by TO2 in FIG. 3). The CRC code outputted in serial is added to the transmitted data signal. In TO2, the select signal 132 is "0".

Note that in FIG. 3, the select signal 132 is "1" in all periods other than TO2; however, the present invention is not limited to this. As long as the select signal 132 is "1" in TC1 and TO1, and is "0" in TO2, the select signal 132 may be either "1" or "0" in the other period.

Accordingly, the cyclic redundancy check circuit (the CRC circuit) can switch between the case where the CRC code corresponding to the received data signal is calculated and the CRC code is outputted in parallel and the case where the CRC code corresponding to the transmitted data signal is calculated and the CRC code is sequentially outputted in serial.

In addition, as shown in FIG. 1, the cyclic redundancy check circuit can have a structure including a determination circuit 105. The first shift register SR 1 to the p-th shift register SR p have a structure including s (s is a natural number equal to or greater than p) memory circuits storing a 1-bit signal. Here, with reference to FIG. 5A, the total number of stages included in the first shift register SR 1 to the p-th shift register SR p corresponds to s. As shown in FIG. 1, signals stored in the s memory circuits are inputted to the determination circuit 105 as the s-bit output 104 in parallel. The s-bit output 104 is a CRC code corresponding to the received data signal. The determination circuit 105 outputs a different signal as an output 106, in response to whether the s-bit output matches a predetermined s-bit signal 144. The predetermined s-bit signal 144 is stored in a memory circuit other than the s memory circuits. For example, the predetermined s-bit signal 144 is stored in a mask ROM or the like.

Accordingly, the cyclic redundancy check circuit (the CRC circuit) can calculate the CRC code corresponding to the received data signal, output the CRC code in parallel, and determine whether the CRC code matches the predetermined signal.

Embodiment Mode 2

In this embodiment mode, a structure of the determination circuit 105 of FIG. 1 is described specifically with reference to FIGS. 4A to 4D and 11A to 11D. Note that the same portions as those in FIGS. 1 and 2 are denoted by the same reference numerals and description thereof is omitted.

Each of FIGS. 4A to 4D and 11A to 11D is a structural example of the determination circuit 105.

Figure 4A:
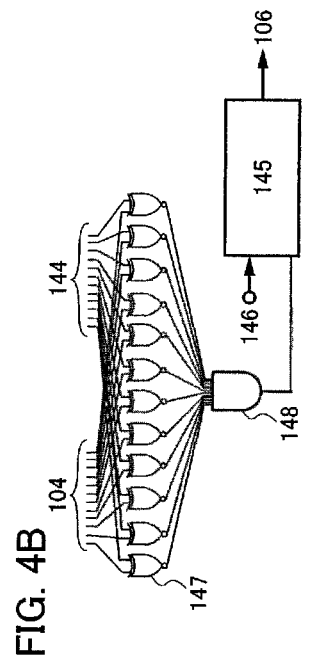
FIGS. 4A to 4D are diagrams showing a structure of Embodiment Mode 2.

In FIG. 4A, the determination circuit 105 includes s matching circuits (EXNORs) 147 and an AND circuit 148. The s matching circuits (EXNORs) 147 determine whether the s-bit output 104 and the predetermined s-bit signal 144 match per bit. That is, one matching circuit (EXNOR) 147 corresponds to a v-th (v is a natural number in the range of 1 to s) bit. A v-th bit signal of the s-bit output 104 and a v-th bit signal of the predetermined s-bit signal 144 are inputted to the matching circuit (EXNOR) 147. In the case where the two inputted signals match, "1" is outputted, and in the case where the two inputted signals do not match, "0" is outputted. Outputs of the s matching circuits (EXNORs) 147 are inputted to the AND circuit 148. In the case where all the outputs of the s matching circuits (EXNORs) 147 are "1", the AND circuit 148 outputs "1", and in the other cases, the AND circuit 148 outputs "0". That is, the AND circuit 148 outputs "1" in the case where the s-bit output 104 and the predetermined s-bit signal 144 match, and the AND circuit outputs "0" in the cases other than that. An output of the AND circuit 148 is the output 106 of the determination circuit 105.

Figure 4B:
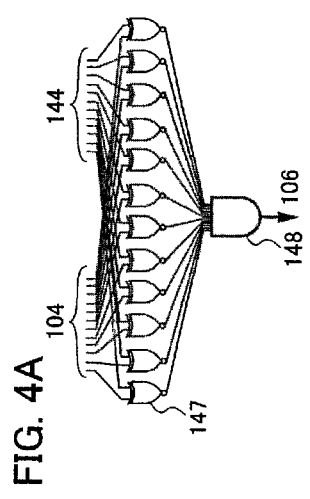

The determination circuit 105 shown in FIG. 4B is different in that the output of the AND circuit 148 is outputted through an output control circuit 145, than the structure shown in FIG. 4A. Since the other portions are the same as those in FIG. 4A, description thereof is omitted. The output of the AND circuit 148 and an output control signal 146 are inputted to the output control circuit 145. The output control circuit 145 controls whether the output of the AND circuit 148 is outputted as the output 106, depending on the output control signal 146. Thus, except when a decision result of the received data signal is outputted, the output 106 can be kept not to be outputted. Therefore, such risk can be prevented that the output 106 becomes "0" during calculation of the CRC code or the like, and a circuit controlled using the decision result malfunctions.

Figure 4C:
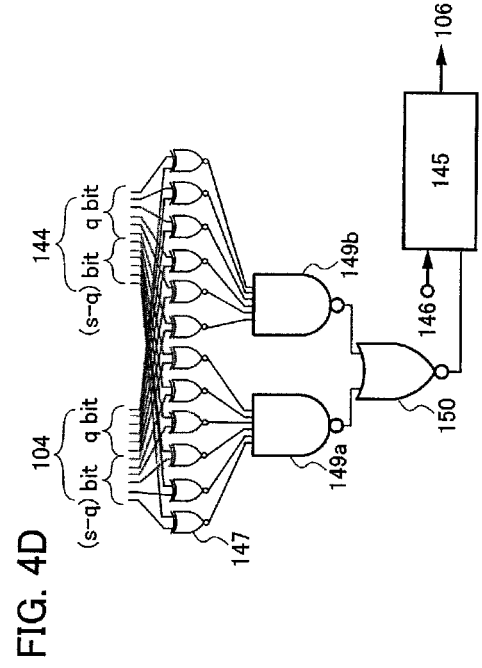

The determination circuit 105 shown in FIG. 4C is different from the structure shown in FIG. 4A in the following points: the outputs of the s matching circuits (EXNORs) 147 are not inputted to the AND circuit 148 but inputted to a first NAND 149a and a second NAND 149b, and outputs of the first NAND 149a and the second NAND 149b are inputted to a NOR 150; and an output of the NOR 150 is the output 106. Since the other portions are the same as those in FIG. 4A, description thereof is omitted. The first NAND 149a determines whether all of a first bit to a q-th (q is a natural number which is 1 or more and less than s) bit signals match in the s-bit output 104 and the predetermined s-bit signal 144. When they match, "0" is outputted, and in the other cases, "1" is outputted. The second NAND 149b determines whether all of a (q+1)th bit to the s bit signals match in the s-bit output 104 and the predetermined s-bit signal 144. When they match, "0" is outputted, and in the other cases, "1" is outputted. Thus, the NOR 150 outputs "1" when the s-bit output 104 and the predetermined s-bit signal 144 match, and the NOR 150 outputs "0" in the other cases.

In the structure shown in FIG. 4C, the AND 148 in FIG. 4A is formed using a plurality of elements of the first NAND 149a, the second NAND 149b, and the NOR 150. Accordingly, in the structure shown in FIG. 4C, the number of input terminals of each element can be reduced. Thus, layout can be facilitated when the determination circuit 105 is actually manufactured.

Figure 4D:
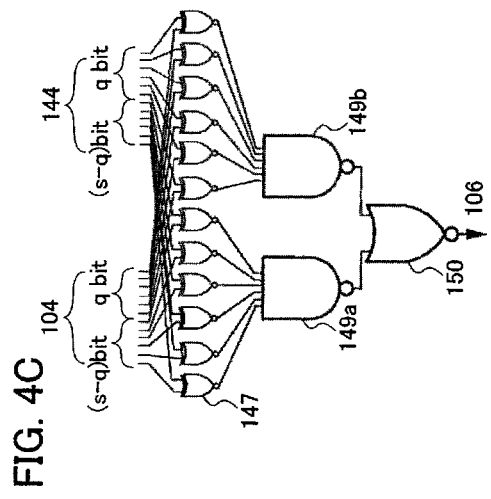

A structure shown in FIG. 4D is different from the structure shown in FIG. 4C in that the output of the NOR 150 is outputted through the output control circuit 145. Since the other portions are the same as those in FIG. 4C, description thereof is omitted. The output of the NOR 150 and the output control signal 146 are inputted to the output control circuit 145. The output control circuit 145 controls whether the output of the NOR 150 is outputted as the output 106, depending on the output control signal 146. Thus, the output 106 can be kept not to be outputted except when a decision result of the received data signal is outputted. Therefore, such risk can be prevented that the output 106 becomes "0" during the calculation of the CRC code or the like, and a circuit controlled using the decision result malfunctions.

Figure 11A:
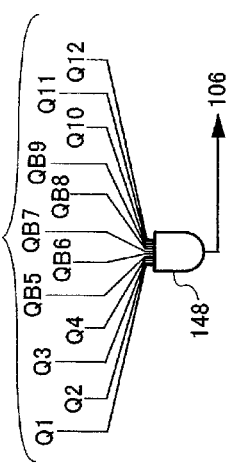
FIGS. 11A to 11D are diagrams showing a structure of Embodiment Mode 2.
Figure 11C:
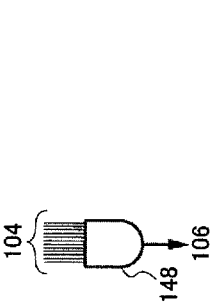
Figure 11B:
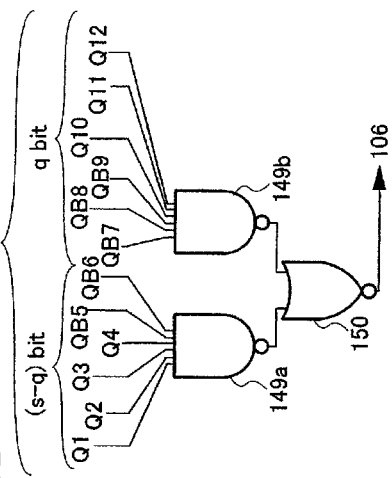

In FIGS. 11A and 11B, the determination circuit 105 includes the AND circuit 148. The circuit shown in FIG. 11A corresponds to the case where the s matching circuits (EXNORs) 147 are eliminated in the circuit shown in FIG. 4A.

In general, the received data signal is considered as data including its CRC code, and it is known that when the CRC code is calculated, an obtained CRC code is a predetermined signal regardless of the received signal. For example, FIG. 11A is an example of the case where all bits of the predetermined s-bit signal 144 are "0". At this time, in the case where the received data signal has no error, all bits of a calculated CRC code are "0". Accordingly, in the case where the received data signal has no error, all of signals inverted with respect to respective bit signals of the calculated CRC code are to be "1". Therefore, the signals inverted with respect to the respective bit signals of the calculated CRC code are inputted to the AND 148 as the s-bit output 104, so that it is possible to determine whether each bit of the calculated CRC code and each bit of the predetermined s-bit signal 144 match. In the case where each bit of the calculated CRC code and each bit of the predetermined s-bit signal 144 match, "1" is outputted, and in the case where each bit of the calculated CRC code and each bit of the predetermined s-bit signal 144 do not match, "0" is outputted.

In addition, FIG. 11B is an example of the case where the predetermined s-bit signal 144 is a 12-bit signal of "111100000111" (described in order from a twelfth bit to a first bit). At this time, in the case where the received data signal has no error, the calculated CRC code is "111100000111" (described in order from a twelfth bit to a first bit). Accordingly, in the case where the received data signal has no error, all signals inverted with respect to only a fourth-bit to an eighth-bit signals of the calculated CRC code (in FIG. 11B, an inverted signal is denoted by QB and a signal which is not inverted is denoted by Q) are to be "1". Accordingly, by inputting the signals inverted with respect to only the fourth-bit to the eighth-bit signals of the calculated CRC code to the AND 148 as the s-bit output 104, it is possible to determine whether each bit of the calculated CRC code and each bit of the predetermined s-bit signal 144 match. In the case where each bit of the calculated CRC code and each bit of the predetermined s-bit signal 144 match, "1" is outputted, and in the case where each bit of the calculated CRC code and each bit of the predetermined s-bit signal 144 do not match, "0" is outputted.

FIG. 11C is an example of the case where all bits of the predetermined s-bit signal 144 are "0" like in FIG. 11A. A difference from FIG. 11A is in that the AND 148 is formed using a plurality of elements of the first NAND 149a, the second NAND 149b, and the NOR 150 similarly to FIG. 4C.

Figure 11D:
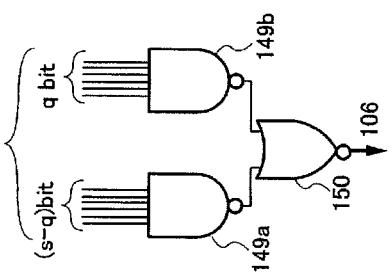
Figure 12:
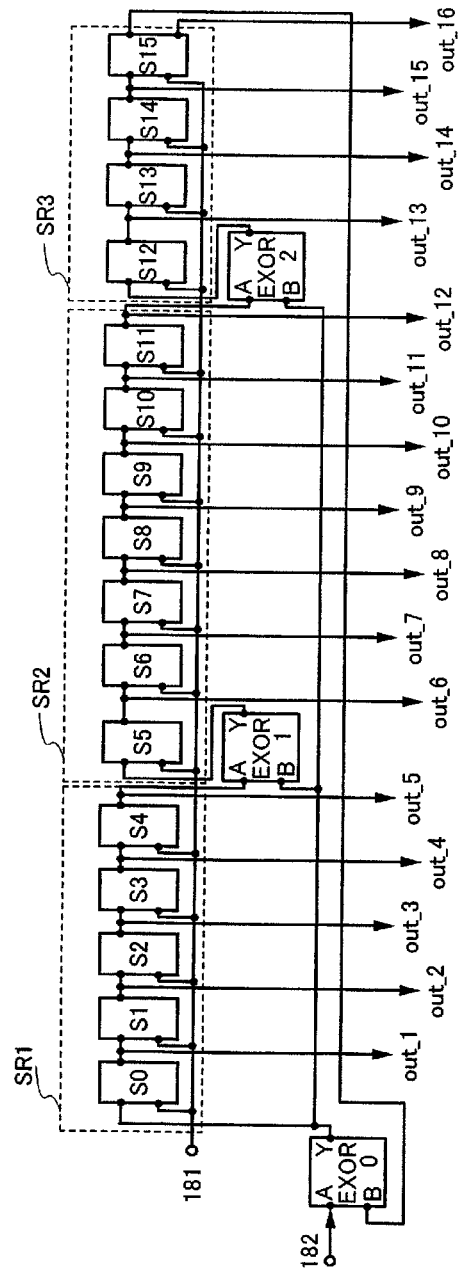
FIG. 12 is a diagram showing a conventional structure.

FIG. 11D is an example of the case where the predetermined s-bit signal 144 is a 12-bit signal of (111100000111) like in FIG. 11B. A difference from FIG. 11B is in that the AND 148 is formed using a plurality of elements of the first NAND 149a, the second NAND 149b, and the NOR 150 similarly to FIG. 4C.

Note that in FIGS. 11A to 11D, similarly to FIGS. 4B and 4D, the output of the AND 148 may be provided with the output control circuit 145.

This embodiment mode can be implemented freely combining with Embodiment Mode 1.

Embodiment Mode 3

In this embodiment mode, a structure corresponding to a standard of CRC16-CCITT (also called CRC-ITU-T) is described. In the standard of CRC16-CCITT, a generator polynomial is denoted by $X^{16}+X^{12}+X^5+1$, and a CRC code has 16 bits; that is, s is 16 in the aforementioned embodiment modes.

A structural example of a cyclic redundancy check circuit corresponding to the standard of CRC16-CCITT is described with reference to FIGS. 6 and 7.

Figure 6:
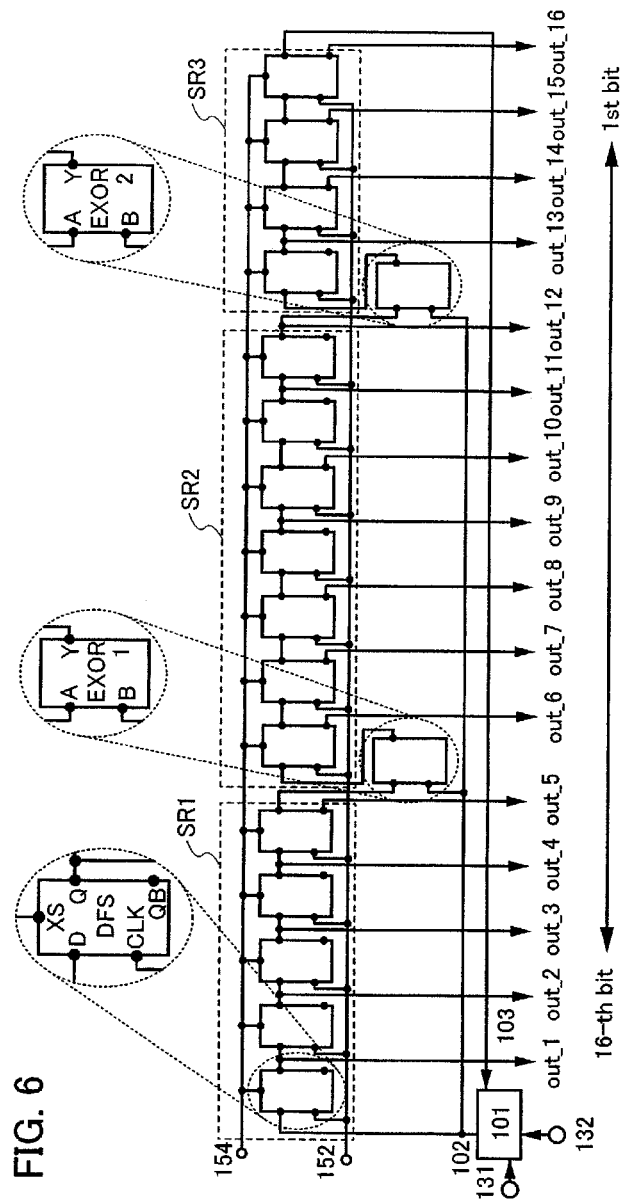
FIG. 6 is a diagram showing a structure of Embodiment Mode 3.

As shown in FIG. 6, the cyclic redundancy check circuit includes the first shift register SR 1, the second shift register SR 2, the third shift register SR 3, the first exclusive OR circuit EXOR 1, the second exclusive OR circuit EXOR 2, and the switching circuit 101.

The first shift register SR 1 has five stages connected in cascade, and outputs an inputted signal having been delayed in synchronization with the clock signal 152 from each stage. That is, an inputted signal is delayed and then outputted from each of the five stages connected in cascade. The output of signals from the five stages is performed in synchronization with a clock signal 152. The second shift register SR 2 has seven stages connected in cascade, and outputs an inputted signal having been delayed in synchronization with the clock signal 152 from each stage. That is, an inputted signal is delayed and then outputted from each of the seven stages connected in cascade. The output of signals from the seven stages is performed in synchronization with a clock signal 152. The third shift register SR 3 has four stages connected in cascade, and outputs an inputted signal having been delayed in synchronization with the clock signal 152 from each stage. That is, an inputted signal is delayed and then outputted from each of the four stages connected in cascade. The output of signals from the four stages is performed in synchronization with a clock signal 152. Each of the first exclusive OR circuit EXOR 1 and the second exclusive OR circuit EXOR 2 calculates an exclusive OR of two inputted signals (corresponding to a signal inputted to A and a signal inputted to B in FIG. 6). The data signal 131, the select signal 132, and the output 103 of a fourth stage of the third shift register SR 3 are inputted to the switching circuit 101, and one of the first signal or the second signal is switched in response to the select signal 132 to be outputted. The output 102 of the switching circuit 101 is inputted to the first stage of the first shift register SR 1. An output of a fifth stage of the first shift register SR 1 and the output 102 of the switching circuit 101 are inputted to the first exclusive OR circuit EXOR 1. An output (corresponding to a signal outputted from Y in FIG. 6) of the first exclusive OR circuit EXOR 1 is inputted to a first stage of the second shift register SR 2. An output of a seventh stage of the second shift register SR 2 and the output 102 of the switching circuit 101 are inputted to the second exclusive OR circuit EXOR 2. An output (corresponding to a signal outputted from Y in FIG. 6) of the second exclusive OR circuit EXOR 2 is inputted to a first stage of the third shift register SR 3.

The first signal is an exclusive OR of the data signal 131 and the output of the fourth stage of the third shift register SR 3, and the second signal is "0". Note that the second signal is not limited as long as the output of the first exclusive OR circuit EXOR 1 is equalized with the output of the fifth stage of the first shift register SR 1 when the second signal is inputted to the first exclusive OR circuit EXOR 1, and the output of the second exclusive OR circuit EXOR 2 is equalized with the output of the seventh stage of the second shift register SR 2 when the second signal is inputted to the second exclusive OR circuit EXOR 2.

FIG. 6 shows a structural example in which a set-type D-type flip-flop circuit (denoted by DFS in FIG. 6) is used for each of plural stages included in the first shift register SR 1 to the third shift register SR 3. One set-type D-type flip-flop circuit DFS is a memory circuit for storing a 1-bit signal and corresponds to one stage. Outputs of 16 set-type D-type flip-flop circuits DFSs are a 16-bit CRC code. A shift register reset signal 154 is inputted to set terminals (each denoted by XS in FIG. 6) of the 16 set-type D-type flip-flop circuits DFSs. With the shift register reset signal 154, before starting calculation of the CRC code, information stored in the 16 set-type D-type flip-flop circuits DFSs can be initialized.

Since a structure of the switching circuit 101 and an operation thereof are the same as those of described in Embodiment Mode 1 with reference to FIGS. 2 and 3, description thereof is omitted here.

Thus, in response to the standard of CRC16-CCITT, the cyclic redundancy check circuit (the CRC circuit) can switch between the case where the CRC code corresponding to the received data signal is calculated and the CRC code is outputted in parallel and the case where the CRC code corresponding to the transmitted data signal is calculated and the CRC code is sequentially outputted in serial.

Figure 7:
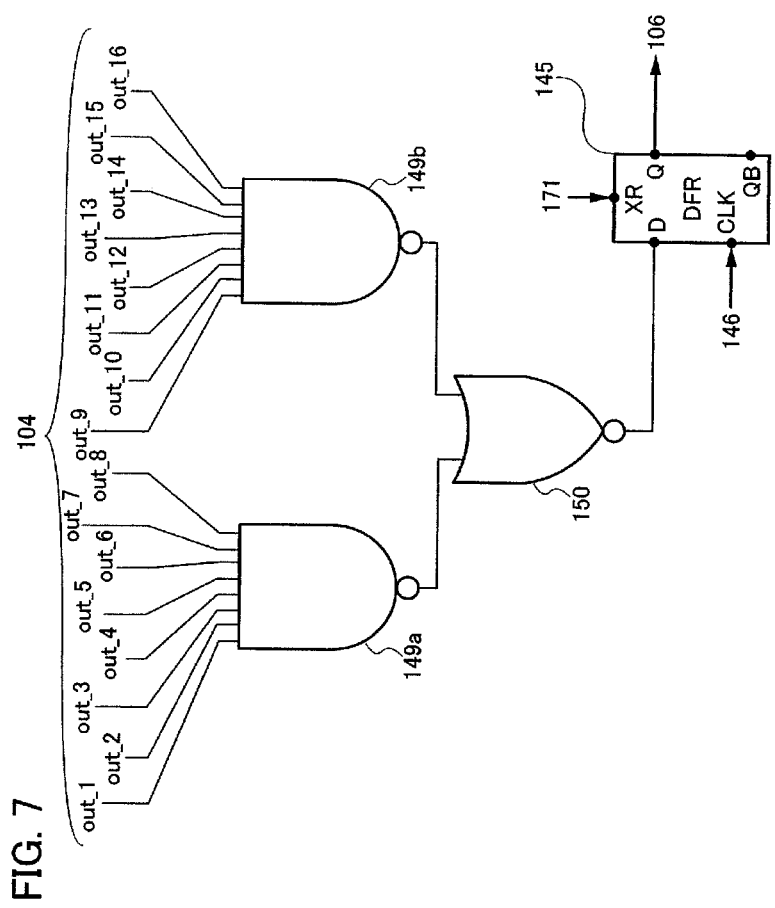
FIG. 7 is a diagram showing a structure of Embodiment Mode 3.

In addition, the cyclic redundancy check circuit may have a determination circuit as shown in FIG. 7. Signals stored in the first shift register SR 1 to the third shift register SR 3 in FIG. 6 are inputted to the determination circuit as the 16-bit output 104 in parallel. The determination circuit outputs a different signal in response to whether the 16-bit output 104 matches the predetermined 16-bit signal 144.

Here, the receive data signal is considered as data including its CRC code, and it is known that when the CRC code is calculated, an obtained CRC code is a predetermined signal regardless of the received data signal. It is known that in the case of the standard of CRC16CCITT, a predetermined signal is "F0B8" in hexadecimal notation, that is, "1111 0000 1011 1000" (described in order from a sixteenth bit to a first bit.) in binary notation. Then, similarly to the structure of the determination circuit shown in FIG. 11D, signals inverted with respect to only signals of the first bit to the third bit, a seventh bit, and a ninth bit to a twelfth bit of the calculated CRC code are inputted to the first NAND 149a and the second NAND 149b as the s-bit output 104. Therefore, as shown in FIG. 6, the first shift register SR 1 to the third shift register SR 3, an inverted output (QB) of the DFS is an output in stages corresponding to the signals of the first bit to the third bit, the seventh bit, and the ninth bit to the twelfth bit of the calculated CRC code, while a non-inverted output (Q) of the DFS is an output in the other stages. Thus, in the case where each bit of the calculated CRC code and each bit of the predetermined s-bit signal 144 match, "1" is outputted, and in the case where each bit of the calculated CRC code and each bit of the predetermined s-bit signal 144 do not match, "0" is outputted. Therefore, an error of the received data signal can be determined.

Note that in the determination circuit shown in FIG. 7, the output of the NOR 150 is inputted to the output control circuit 145. The output of the output control circuit 145 is the output 106 of the determination circuit. A structure of the output control circuit 145 is basically similar to the structures described in Embodiment Mode 2 with reference to FIGS. 4B and 4D. The output control circuit 145 in FIG. 7 is formed of a reset-type D-type flip-flop circuit (denoted by DFR in FIG. 7). An output reset signal 171 is inputted to a reset terminal (denoted by XR in FIG. 7) of the reset-type D-type flip-flop circuit DFR. Depending on the output reset signal 171, before the determination circuit outputs a result, the output of the determination circuit can be initialized.

Although an example of the case corresponding to the standard of CRC16-CCITT is described in this embodiment mode, the present invention is not limited to this. The present invention can be applied to a cyclic redundancy check circuit corresponding to an arbitrary standard.

This embodiment mode can be implemented freely combining with Embodiment Mode 1 and Embodiment Mode 2.

Embodiment Mode 4

In this embodiment mode, more specific structures of the selector 112 included in the switching circuit 101 in FIG. 2, the set-type D-type flip-flop circuit DFS in FIG. 6, and the reset-type D-type flip-flop circuit DFR in FIG. 7 are described.

Figures 8A, 8B:
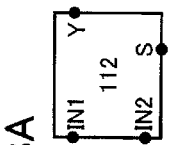
FIGS. 8A and 8B are diagrams showing a structure of Embodiment Mode 4.

FIGS. 8A and 8B show a structure of the selector 112. FIG. 8A shows a block diagram of the selector 112 and FIG. 8B shows a circuit diagram corresponding to FIG. 8A. The selector 112 includes two inverter circuits, six P-channel transistors, and six N-channel transistors.

Figures 9A, 9B:
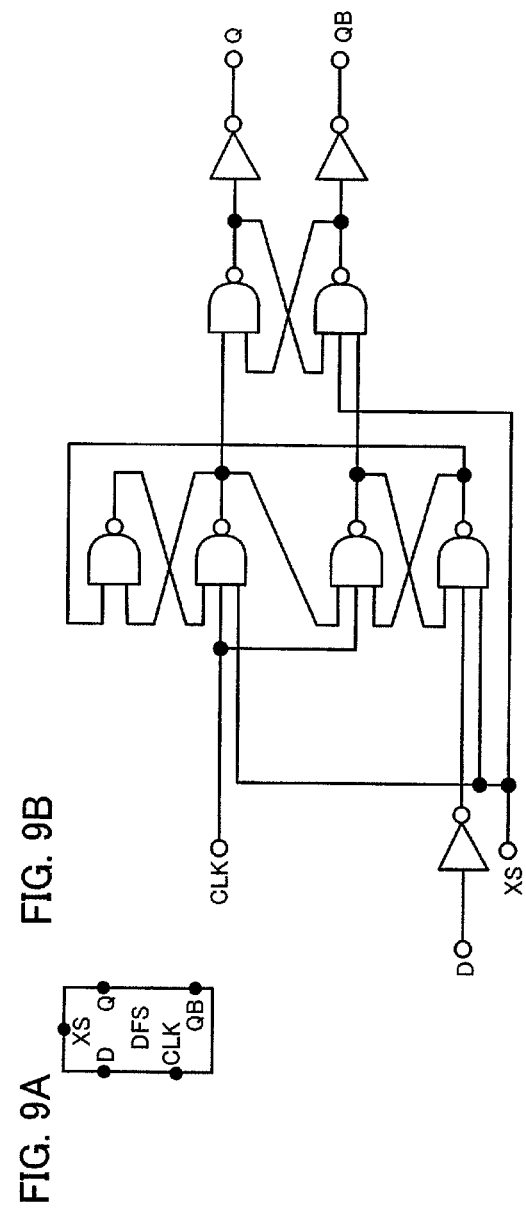
FIGS. 9A and 9B are diagrams showing a structure of Embodiment Mode 4.

FIGS. 9A and 9B show a structure of the set-type D-type flip-flop circuit DFS. FIG. 9A shows a block diagram of the set-type D-type flip-flop circuit DFS, and FIG. 9B shows a circuit diagram corresponding to FIG. 9A. The set-type D-type flip-flop circuit DFS includes three inverter circuits and six NAND circuits.

Figures 10A, 10B:
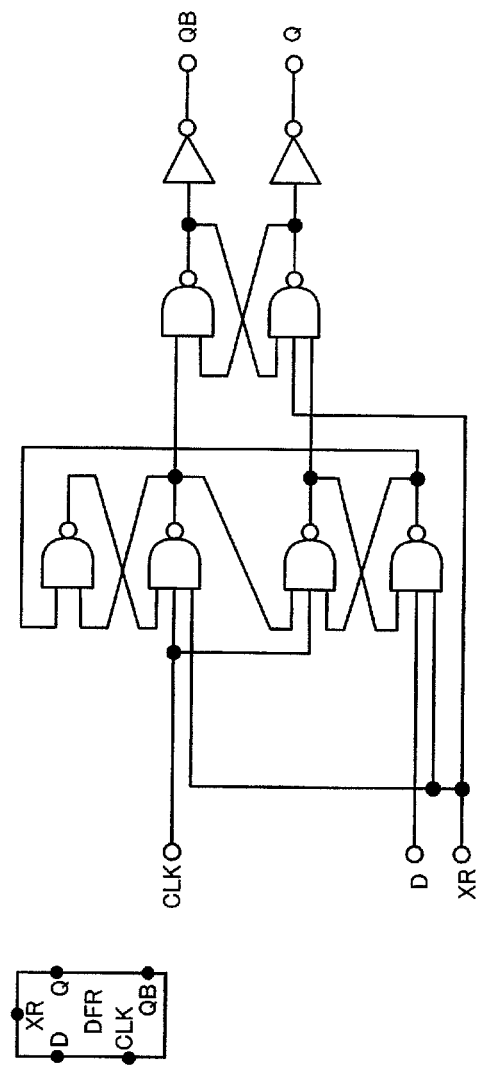
FIGS. 10A and 10B are diagrams showing a structure of Embodiment Mode 4.

FIGS. 10A and 10B show a structure of the reset-type D-type flip-flop circuit DFR. FIG. 10A shows a block diagram of the reset-type D-type flip-flop circuit DFR, and FIG. 10B shows a circuit diagram corresponding to FIG. 10A. The reset-type D-type flip-flop circuit DFR includes two inverter circuits and six NAND circuits.

This embodiment mode can be implemented freely combining with Embodiment Modes 1 to 3.

Embodiment Mode 5

In this embodiment mode, the case where the cyclic redundancy check circuits described in the aforementioned Embodiment Modes 1 to 4 are used for a semiconductor device (hereinafter also called a wireless tag) capable of communicating data by wireless communication and a wireless communication system using the semiconductor device is described.

Figure 13A:
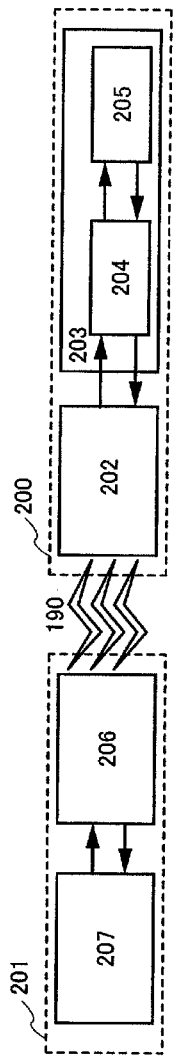
FIGS. 13A and 13B are diagrams showing a structure of Embodiment Mode 5.

FIG. 13A shows a structure of a wireless communication system including a wireless tag 200 and a reader/writer 201 for communicating data with the wireless tag 200 by wireless communication. The wireless tag 200 includes an antenna 202, and a circuit portion 203 which transmits and receives signals to/from the antenna 202. The reader/writer 201 includes an antenna 206 and a circuit portion 207 which transmits and receives signals to/from the antenna 206. The wireless tag 200 and the reader/writer 201 communicate data by transmitting and receiving a modulated carrier wave 190 (also called a wireless signal), using the antenna 202 and the antenna 206. The circuit portion 203 includes an analog portion 204 and a digital portion 205. The analog portion 204 transmits and receives signals to/from the antenna 202. The digital portion 205 transmits and receives signals to/from the analog portion 204.

Figure 13B:
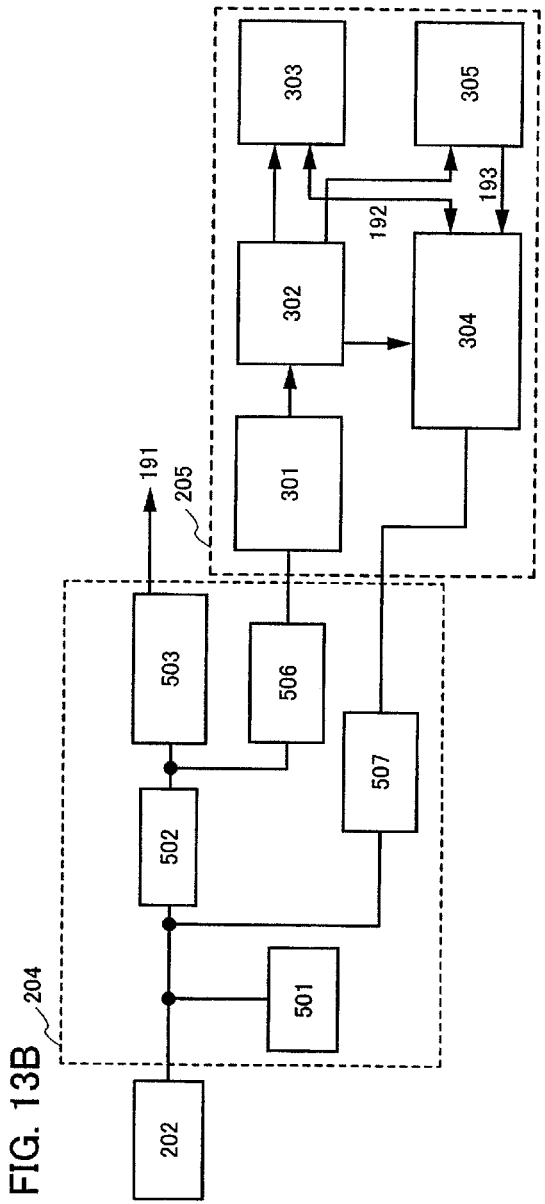

FIG. 13B shows a structure of the analog portion 204 and the digital portion 205. The analog portion 204 includes a resonant capacitor 501, a pass-band filter 502, a power supply circuit 503, a demodulation circuit 506, and a modulation circuit 507. The resonant capacitor 501 is provided so that the antenna 202 can easily receive a signal with a predetermined frequency. The digital portion 205 includes a code extraction circuit 301, a code determination circuit 302, a cyclic redundancy check circuit 303, a memory circuit 305, and a control circuit 304.

The case where the wireless tag 200 receives data is described. A modulated carrier wave inputted from the antenna 202, from which noise is removed by the pass-band filter 502, is inputted to the power supply circuit 503 and the demodulation circuit 506. The power supply circuit 503 has a rectifier circuit and a storage capacitor. The modulated carrier wave inputted via the pass-band filter 502 is rectified by the rectifier circuit and smoothed by the storage capacitor. In this manner, the power supply circuit 503 generates a DC voltage. A DC voltage 191 generated in the power supply circuit 503 is supplied as a power supply voltage to each circuit in the circuit portion 203 included in the wireless tag 200. The modulated carrier wave inputted via the pass-band filter 502 is demodulated by the demodulation circuit 506, and the demodulated signal is inputted to the digital portion 205. An inputted signal from the analog portion 204, that is, a signal which is made by demodulating a modulated carrier wave by the demodulation circuit 506, is inputted to the code extraction circuit 301, and a code of the signal is extracted. An output of the code extraction circuit 301 is inputted to the code determination circuit 302, and the extracted code is analyzed. The analyzed code is inputted to the cyclic redundancy check circuit 303, and an arithmetic processing for identifying a transmission error is performed. Then, the cyclic redundancy check circuit 303 outputs to the control circuit 304 a decision result 192 of whether the received data signal has an error.

Next, the case where the wireless tag 200 transmits data is described. The memory circuit 305 outputs a stored unique identifier 193 (UID) to the control circuit 304, in response to a signal inputted from the code determination circuit 302. The cyclic redundancy check circuit 303 calculates the CRC code corresponding to the transmitted data signal and outputs the CRC code to the control circuit 304. The control circuit 304 adds the CRC code to the transmitted data signal. The control circuit 304 encodes data in which the CRC code is added to the transmitted data signal. In addition, the control circuit 304 converts the encoded information into a signal for modulating the carrier wave in response to a predetermined modulation method. The output of the control circuit 304 is inputted to the modulation circuit 507 of the analog portion 204. The modulation circuit 507 load-modulates the carrier wave in response to the inputted signal and outputs the carrier wave to the antenna 202.

The frequency of a carrier wave, the subcarrier frequency, the data transmission rate, the encoding method, or the like can be arbitrary decided. For example, as for the frequency of a carrier wave, any of the following can be employed: a submillimeter wave of 300 GHz or more and 3 THz or less; a millimeter wave of 30 GHz or more and less than 300 GHz; a microwave of 3 GHz or more and less than 30 GHz; an ultrashort wave of 300 MHz or more and less than 3 GHz; a very short frequency of 30 MHz or more and less than 300 MHz; a short wave of 3 MHz or more and less than 30 MHz; a medium wave of 300 KHz or more and less than 3 MHz; a long wave of 30 KHz or more and less than 300 KHz; and a very long wave of 3 KHz or more and less than 30 KHz.

This embodiment mode can be implemented freely combining with Embodiment Modes 1 to 4.

Embodiment 1

In this embodiment, a specific structure of a semiconductor device of the present invention is described with reference to FIGS. 14A to 16B.

Figure 14A:
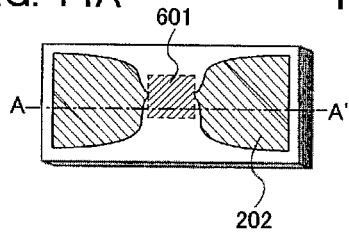
FIGS. 14A to 14D are diagrams showing Embodiment 1.
Figure 14B:
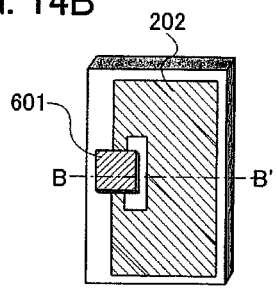
Figure 14C:
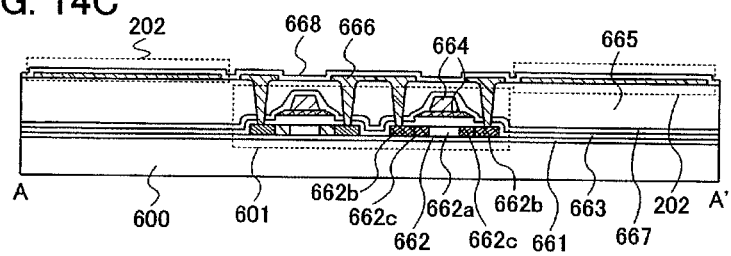
Figure 14D:
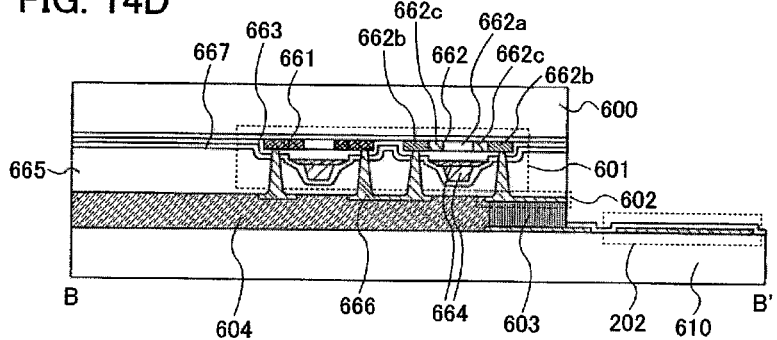

FIGS. 14A to 14D show a structural example of the antenna 202 in the semiconductor device of the present invention. The antenna 202 is provided in two ways, one of which (hereinafter called a first antenna installation system) is shown in FIGS. 14A and 14C and the other (hereinafter called a second antenna installation system) is shown in FIGS. 14B and 14D. FIG. 14C is a cross-sectional view along a line A-A' of FIG. 14A, while FIG. 14D is a cross-sectional view along a line B-B' of FIG. 14B.

According to the first antenna installation system, the antenna 202 is provided over a substrate 600 over which a plurality of elements (hereinafter called an element group 601) are provided (see FIGS. 14A and 14C). A circuit (a circuit portion 203) other than the antenna in the semiconductor device of the present invention is formed of the element group 601. The element group 601 includes a plurality of thin film transistors. In the shown structure, a conductive film functioning as the antenna 202 is provided in the same layer (over the same insulating surface) as a wire which is connected to a source or drain of the thin film transistor included in the element group 601. However, the conductive film functioning as the antenna 202 may be provided in the same layer as a gate electrode 664 of the thin film transistor included in the element group 601, or may be provided over an insulating film which is provided so as to cover the element group 601.

According to the second antenna installation system, a terminal portion 602 is provided over the substrate 600 over which the element group 601 is provided. Then, the terminal portion 602 is connected to the antenna 202 which is formed over a substrate 610 which is different from the substrate 600 (see FIGS. 14B and 14D). In the shown structure, a part of a wire connected to a source or drain of the thin film transistor included in the element group 601 may be used as the terminal portion 602. Then, the substrate 600 is attached to the substrate 610 over which the antenna 202 is provided, so that the antenna 202 is connected to the terminal portion 602. A conductive particle 603 and a resin 604 are provided between the substrate 600 and the substrate 610. The antenna 202 is electrically connected to the terminal portion 602 with the conductive particle 603.

The structure and manufacturing method of the element group 601 is described. When a plurality of element groups 601 are formed over a large substrate and cut off to be completed, an inexpensive element group can be provided. As the substrate 600, for example, a glass substrate made of barium borosilicate glass, alumino borosilicate glass, or the like, a quartz substrate, a ceramic substrate, or the like can be used. Alternatively, a semiconductor substrate of which the surface is provided with an insulating film may be used. A substrate made of a flexible synthetic resin such as plastic may also be used. The surface of the substrate may be planarized by polishing using a CMP (Chemical Mechanical Polishing) method or the like. A substrate which is thinned by polishing a glass substrate, a quartz substrate, or a semiconductor substrate may be used as well.

As a base layer 661 formed over the substrate 600, an insulating film made of silicon oxide, silicon nitride, silicon nitride oxide ($SiO_xN_y$ or $SiN_xO_y$; note that x>y), or the like can be used. The base layer 661 can prevent an alkali metal such as Na or an alkaline earth metal contained in the substrate 600, from being diffused in a semiconductor layer 662 and adversely affecting the characteristics of the thin film transistor. Although the base layer 661 shown in FIGS. 14C and 14D has a single layer structure, it may have a two or more layer structure. Note that if the diffusion of impurities is not a serious problem such as in a quartz substrate, the base layer 661 is not necessarily provided.

Note that the surface of the substrate 600 may be directly processed by high density plasma. The high density plasma is generated using a high frequency wave, for example, 2.45 GHz. High density plasma with an electron density of $10^{11}$ to $10^{13}/cm^3$, an electron temperature of 2 eV or lower, and an ion energy of 5 eV or lower is used. Since such high density plasma featuring a low electron temperature has low kinetic energy of active species, a film with less plasma damage and defects can be formed compared to that formed by a conventional plasma treatment. Plasma can be generated using a plasma processing apparatus utilizing high frequency excitation, which employs a radial slot antenna. The distance between the antenna which generates a high frequency wave and the substrate 600 is 20 to 80 mm (preferably, 20 to 60 mm).

The surface of the substrate 600 can be nitrided by performing the high density plasma treatment in a nitrogen atmosphere, for example an atmosphere containing nitrogen (N) and a rare gas (containing at least one of He, Ne, Ar, Kr, and Xe), an atmosphere containing nitrogen, hydrogen (H), and a rare gas, or an atmosphere containing ammonium ($NH_3$) and a rare gas. When the substrate 600 is made of glass, quartz, a silicon wafer, or the like, a nitride layer formed over the surface of the substrate 600, which contains silicon nitride as a main component, can be used as a blocking layer against impurities diffused from the substrate 600 side. A silicon oxide film or a silicon oxynitride film may be formed over the nitride layer by a plasma CVD method to be used as the base layer 661.

When similar high density plasma treatment is applied to the surface of the base layer 661 made of silicon oxide, silicon oxynitride, or the like, the surface and a region with a depth of 1 to 10 nm from the surface can be nitrided. This extremely thin silicon nitride layer is favorable since it functions as a blocking layer and has less stress on the semiconductor layer 662 formed thereover.

As the semiconductor layer 662, an island-shaped crystalline semiconductor film or an island-shaped amorphous semiconductor film can be used. Alternatively, an organic semiconductor film may be used. A crystalline semiconductor film can be obtained by crystallizing an amorphous semiconductor film. A laser crystallization method, a thermal crystallization method using RTA (Rapid Thermal Anneal) or an annealing furnace, a thermal crystallization method using a metal element which promotes crystallization, or the like can be used as the crystallization method. The semiconductor layer 662 includes a channel forming region 662a and a pair of impurity regions 662b to which an impurity element imparting conductivity is added. Shown here is a structure where low concentration impurity regions 662c to which the impurity element is added at a lower concentration than to the impurity regions 662b are provided between the channel forming region 662a and the pair of impurity regions 662b; however, the present invention is not limited to this. The low concentration impurity regions 662c are not necessarily provided.

Figure 16A:
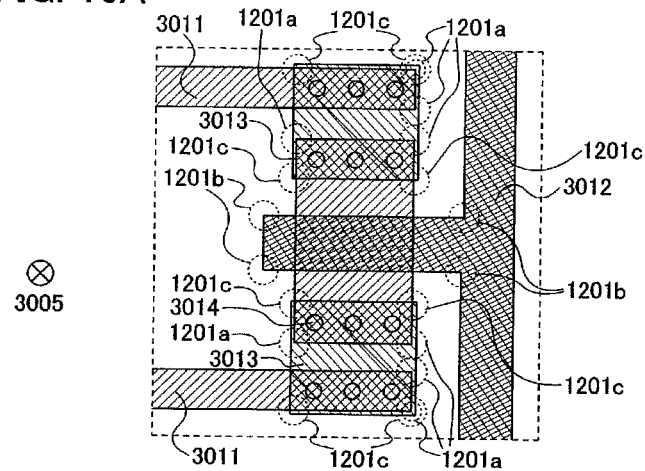
FIGS. 16A and 16B are diagrams showing Embodiment 1.
Figure 16B:
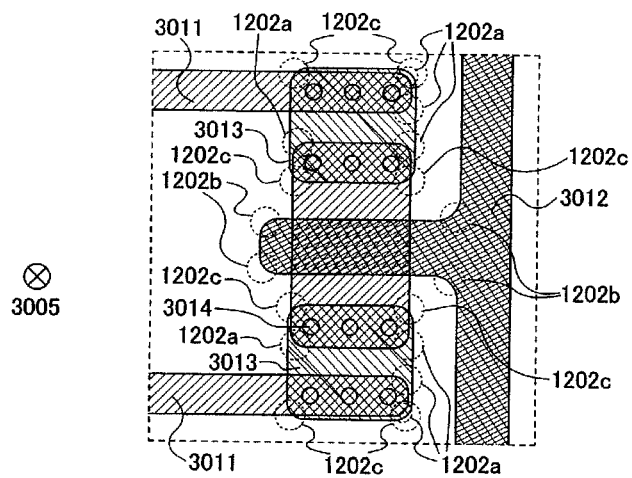

Note that a wire which is formed at the same time as the semiconductor layer 662 is preferably led so that corners are rounded when seen from a direction perpendicular to the top surface of the substrate 600. FIGS. 16A and 16B are schematic views each showing the method to lead the wire. In FIGS. 16A and 16B, a direction 3005 perpendicular to the top surface of the substrate 600 is shown. A wire 3011 denotes the wire which is formed at the same time as the semiconductor layer. FIG. 16A shows a conventional method to lead a wire. FIG. 16B shows a method of the present invention to lead a wire. Corners 1202a are rounded as compared to conventional corners 1201a. The rounded corners can prevent dust or the like from remaining at the corners of the wire. As a result, defects of a semiconductor device caused by dust can be reduced and the yield can be improved.

An impurity element which imparts conductivity may be added to the channel forming region 662a of the thin film transistor. In this manner, a threshold voltage of the thin film transistor can be controlled.

A first insulating layer 663 can have a single layer or a stack of a plurality of films made of silicon oxide, silicon nitride, silicon nitride oxide ($SiO_xN_y$ or $SiN_xO_y$; note that x>y), or the like. In this case, the surface of the first insulating layer 663 may be processed by high density plasma in an oxygen atmosphere or a nitrogen atmosphere, thereby being oxidized or nitrided to be densified. The high density plasma is generated using a high frequency wave, for example, 2.45 GHz, as described above. Note that high density plasma with an electron density of $10^{11}$ to $10^{13}/cm^3$, an electron temperature of 2 eV or lower, and an ion energy of 5 eV or lower is used. Plasma can be generated using a plasma processing apparatus utilizing high frequency excitation, which employs a radial slot antenna. In the apparatus for generating high density plasma, the distance between the antenna which generates a high frequency wave and the substrate 600 is 20 to 80 mm (preferably, 20 to 60 mm).

Before forming the first insulating layer 663, the high density plasma treatment may be applied to the surface of the semiconductor layer 662 so that the surface of the semiconductor layer is oxidized or nitrided. At this time, by performing the treatment in an oxygen atmosphere or a nitrogen atmosphere with the substrate 600 at a temperature of 300 to 450° C., a favorable interface with the first insulating layer 663 which is formed over the semiconductor layer 662 can be obtained.

As the nitrogen atmosphere, an atmosphere containing nitrogen (N) and a rare gas (containing at least one of He, Ne, Ar, Kr, and Xe), an atmosphere containing nitrogen, hydrogen (H), and a rare gas, or an atmosphere containing ammonium ($NH_3$) and a rare gas can be used. As the oxygen atmosphere, an atmosphere containing oxygen (O) and a rare gas, an atmosphere containing oxygen, hydrogen (H), and a rare gas, or an atmosphere containing dinitrogen monoxide ($N_2O$) and a rare gas can be used.

The gate electrode 664 can be formed using one element selected from Ta, W, Ti, Mo, Al, Cu, Cr, or Nd, or an alloy or a compound containing a plurality of the above-described elements. Furthermore, the gate electrode 664 may have a single layer structure or a stacked-layer structure made of the above-described elements, or an alloy or a compound thereof. In FIGS. 14C and 14D, the gate electrode 664 has a two-layer structure. Note that the gate electrode 664 and a wire which is formed at the same time as the gate electrode 664 are preferably led so that corners thereof are rounded when seen from the direction perpendicular to the top surface of the substrate 600. The gate electrode 664 and the wire can be led in the same manner as that shown in FIG. 16B. The gate electrode 664 and a wire 3012 which is formed at the same time as the gate electrode 664 are shown in the drawings. When corners 1202b are rounded as compared to corners 12016, dust or the like can be prevented from remaining at the corners of the wire. As a result, defects of a semiconductor device caused by dust can be reduced and the yield can be improved.

A thin film transistor is formed of the semiconductor layer 662, the gate electrode 664, and the first insulating layer 663 functioning as a gate insulating film between the semiconductor layer 662 and the gate electrode 664. In this embodiment, the thin film transistor has a top gate structure; however, it may be a bottom gate transistor having a gate electrode under the semiconductor layer, or a dual gate transistor having gate electrodes over and under the semiconductor layer.

A second insulating layer 667 is desirably an insulating film such as a silicon nitride film, which has barrier properties to block ion impurities. The second insulating layer 667 is made of silicon nitride or silicon oxynitride. The second insulating layer 667 functions as a protective film to prevent contamination of the semiconductor layer 662. After depositing the second insulating layer 667, hydrogen gas may be introduced and the aforementioned high density plasma treatment may be applied, thereby hydrogenating the second insulating layer 667. Alternatively, the second insulating layer 667 may be nitrided and hydrogenated by introducing ammonium ($NH_3$) gas. Otherwise, oxidization-nitridation treatment and hydrogenation treatment may be performed by introducing oxygen, dinitrogen monoxide ($N_2O$) gas, and the like together with hydrogen gas. By performing nitridation treatment, oxidization treatment, or oxidization-nitridation treatment in this manner, the surface of the second insulating layer 667 can be densified. As a result, the function of the second insulating layer 667 as a protective film can be enhanced. Hydrogen introduced into the second insulating layer 667 is discharged when thermal treatment is applied at a temperature of 400 to 450° C., thereby hydrogenating the semiconductor layer 662. Note that the hydrogenation treatment may be performed in combination with hydrogenation treatment using the first insulating layer 663.

A third insulating layer 665 can have a single layer structure or a stacked-layer structure of an inorganic insulating film or an organic insulating film. As the inorganic insulating film, a silicon oxide film formed by a CVD method, a silicon oxide film formed by an SOG (Spin On Glass) method, or the like can be used. As the organic insulating film, a film made of polyimide, polyamide, BCB (benzocyclobutene), acrylic, a positive photosensitive organic resin, a negative photosensitive organic resin, or the like can be used.

The third insulating layer 665 may be made of a material having a skeleton structure formed of a bond of silicon (Si) and oxygen (O). An organic group containing at least hydrogen (such as an alkyl group and aromatic hydrocarbon) is used as a substituent of this material. Alternatively, a fluoro group may be used as the substituent. Further alternatively, a fluoro group and an organic group containing at least hydrogen may be used as the substituent.

A wire 666 can be formed using one element selected from Al, Ni, W, Mo, Ti, Pt, Cu, Ta, Au, or Mn, or an alloy containing a plurality of the above-described elements. The wire 666 can have a single layer structure or a stacked-layer structure of the element or the alloy. In FIGS. 14C and 14D, a single layer structure is shown as an example. Note that the wire 666 is preferably led so that corners thereof are rounded when seen from the direction perpendicular to the top surface of the substrate 600. The wire can be led in the same manner as that shown in FIG. 16B. The wire 666 is denoted by the wire 3013 in the drawings. When corners 1202c are rounded as compared to corners 1201c, dust or the like can be prevented from remaining at the corners of the wire. As a result, defects of a semiconductor device caused by dust can be reduced and the yield can be improved. The wire 3013 is connected to the wire 3011 by contact holes 3014. In the structures shown in FIGS. 14A and 14C, the wire 666 functions as a wire connected to the source or drain of the thin film transistor and as the antenna 202. In the structures shown in FIGS. 14B and 14D, the wire 666 functions as the wire connected to the source or drain of the thin film transistor and as a terminal portion 602.

The antenna 202 can also be formed by a droplet discharge method using a conductive paste containing nano-particles such as Au, Ag, and Cu. The droplet discharge method is a collective term for a method for forming a pattern by discharging droplets, such as an ink jet method and a dispenser method, which has advantages in that the utilization efficiency of a material is improved, and the like.

In the structures shown in FIGS. 14A and 14C, a fourth insulating layer 668 is formed over the wire 666. The fourth insulating layer 668 can have a single layer structure or a stacked-layer structure of an inorganic insulating film or an organic insulating film. The fourth insulating layer 668 functions as a protective layer of the antenna 202.

Figure 15A:
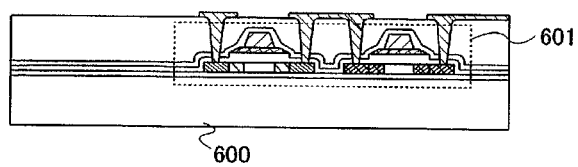
FIGS. 15A to 15D are diagrams showing Embodiment 1.
Figure 15B:
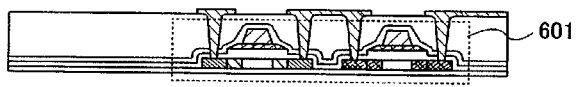
Figure 15C:
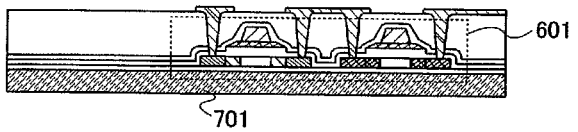
Figure 15D:
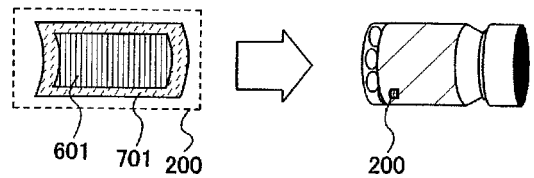

Although the element group 601 may use the one formed over the substrate 600 (see FIG. 15A) as it is, the element group 601 over the substrate 600 may be peeled off (see FIG. 15B), and the element group 601 may be attached to a flexible substrate 701 (see FIG. 15C). The flexible substrate 701 has flexibility, and for example, a plastic substrate such as polycarbonate, polyarylate, and polyethersulfone, a ceramic substrate, or the like can be used.

As a method for peeling the element group 601 from the substrate 600, any of the following can be used: (A) a method in which a peeling layer is provided in advance between the substrate 600 and the element group 601 and the peeling layer is removed by an etchant; (B) a method in which the peeling layer is partially removed by an etchant, and then the substrate 600 and the element group 601 are peeled physically; and (C) a method in which the substrate 600 with high heat resistance over which the element group 601 is formed is eliminated mechanically or removed by etching with a solution or gas so that the element group 601 is peeled. Note that "to be peeled by a physical means" denotes that to be peeled by applying stress from outside, for example, to be peeled by applying stress from a wind pressure of gas sprayed from a nozzle, an ultrasonic wave, or the like.

As a specific method of the aforementioned (A) or (B), a method in which a metal oxide film is provided between the substrate 600 with high heat resistance and the element group 601, and the metal oxide film is weakened by crystallization to peel the element group 601 can be used. As another example of more specific method of the aforementioned (A) or (B), a method in which an amorphous silicon film containing hydrogen is provided between the substrate 600 with high heat resistance and the element group 601, and the amorphous silicon film is removed by irradiation with a laser beam or etching so that the element group 601 is peeled can be used.

In addition, to attach the peeled element group 601 to the flexible substrate 701, a commercial adhesive may be used, and for example, an adhesive such as an epoxy resin-based adhesive or a resin additive may be used.

By attaching the element group 601 to the flexible substrate 701 over which the antenna is formed and electrically connecting the element group 601 and the antenna, a thin and light semiconductor device which is not easily broken even when fallen to the ground, is obtained (see FIG. 15C). When an inexpensive flexible substrate 701 is used, an inexpensive semiconductor device can be provided. Furthermore, the flexible substrate 701 having flexibility can be attached to a curved surface or an irregular-shaped substance, which realizes various kinds of usage. For example, the wireless tag 200 as one mode of a semiconductor device of the present invention can be attached to a curved surface such as a medicine bottle (see FIG. 15D). Furthermore, when the substrate 600 is reused, a semiconductor device can be manufactured at low cost.

The element group 601 can be sealed by covering with a film. The surface of the film may be coated with silicon dioxide (silica) powder. The coating allows the element group 601 to be kept waterproof in an environment of high temperature and high humidity. In other words, the element group 601 can have moisture resistance. Moreover, the surface of the film may have antistatic properties. The surface of the film may also be coated with a material containing carbon as its main component (such as diamond-like carbon). The strength can be enhanced by coating, and degradation or destruction of a semiconductor device can be suppressed. Alternatively, the film may be formed of a base material (for example, resin) mixed with silicon dioxide, a conductive material, or a material containing carbon as its main component. In addition, a surface active agent may be provided on the surface of the film, or directly added into the film, so that the film can have antistatic properties.

This embodiment can be implemented freely combining with the above-described embodiment modes.

Embodiment 2

Figure 17A:
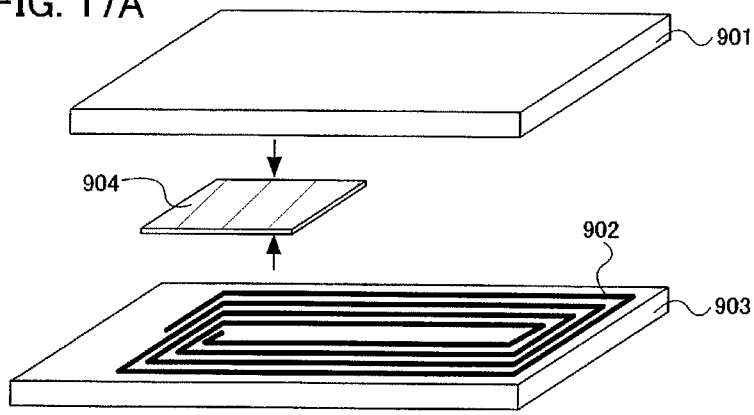
FIGS. 17A to 17C are diagrams showing Embodiment 2.

In this embodiment, an example in which a semiconductor device of the present invention has a flexible structure is described with reference to FIGS. 17A to 17C. In FIG. 17A, a semiconductor device of the present invention includes a flexible protective layer 901, a flexible protective layer 903 including an antenna 902 (corresponding to the antenna 202), and an element group 904 formed by a peeling process or thinning of a substrate. The element group 904 can have a similar structure to the element group 601 described in the Embodiment 1. The antenna 902 formed over the protective layer 903 is electrically connected to the element group 904. In FIG. 17A, the antenna 902 is formed only over the protective layer 903; however, the present invention is not limited to this structure and the antenna 902 may be formed over the protective layer 901 as well. Note that a barrier film made of a silicon nitride film or the like may be formed between the element group 904 and each of the protective layer 901 and the protective layer 903. As a result, contamination of the element group 904 can be prevented, which leads to a semiconductor device with improved reliability.

The antenna 902 can be formed of Ag, Cu, or a metal plated with Ag or Cu. The element group 904 and the antenna 902 can be connected to each other using an anisotropic conductive film and applying ultraviolet treatment or ultrasonic wave treatment. Note that the element group 904 and the antenna 902 may be attached to each other using a conductive paste or the like.

By sandwiching the element group 904 between the protective layer 901 and the protective layer 903, a semiconductor device is completed (see arrows in FIG. 17A).

Figure 17B:
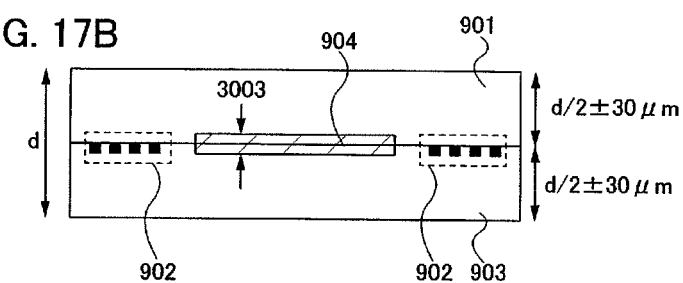
Figure 17C:
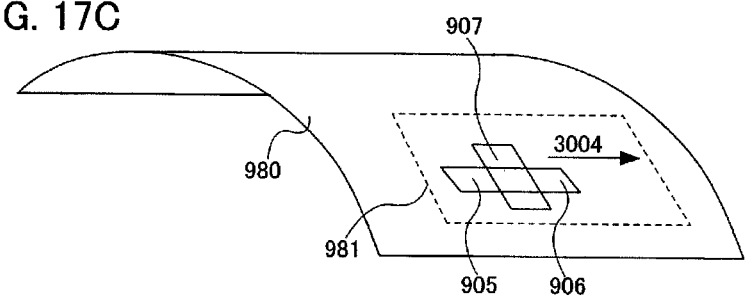

FIG. 17B shows a cross-sectional structure of the thus formed semiconductor device. A thickness 3003 of the element group 904 which is sandwiched is 5 μm or less, and preferably 0.1 to 3 μm. Furthermore, when the protective layer 901 and the protective layer 903 which overlap each other have a thickness of d, each of the protective layer 901 and the protective layer 903 preferably has a thickness of (d/2)±30 μm, and more preferably (d/2)±10 μm. In addition, each of the protective layer 901 and the protective layer 903 desirably has a thickness of 10 to 200 μm. The element group 904 has an area of 10 mm square (100 mm$^2$) or smaller, and desirably 0.3 to 4 mm square (0.09 to 16 mm$^2$).

Each of the protective layer 901 and the protective layer 903 is made of an organic resin material, and thus has high resistance against bending. The element group 904 which is formed by a peeling process or thinning of a substrate also has higher resistance against bending compared to a single crystal semiconductor. Since the element group 904, the protective layer 901, and the protective layer 903 can be tightly attached to each other without any space, a completed semiconductor device itself also has high resistance against bending. The element group 904 surrounded by the protective layer 901 and the protective layer 903 may be provided over a surface of or inside of another object, or embedded in paper.

The case where a semiconductor device including the element group 904 is attached to a substrate having a curved surface is described with reference to FIG. 17C. FIG. 17C shows one transistor 981 selected from the element group 904. In the transistor 981, a current flows from one 905 of a source and a drain to the other 906 of the source and the drain in response to a potential of a gate electrode 907. The transistor 981 is provided so that a direction 3004 of the current flow in the transistor 981 (carrier movement direction) and the direction of the arc of a substrate 980 cross at right angles. With such an arrangement, the transistor 981 is less affected by stress even when the substrate 980 is bent to be an arc, and thus variations in characteristics of the transistor 981 included in the element group 904 can be suppressed.

This embodiment can be implemented freely combining with the aforementioned embodiment modes and Embodiment 1.

Embodiment 3

Figure 20:
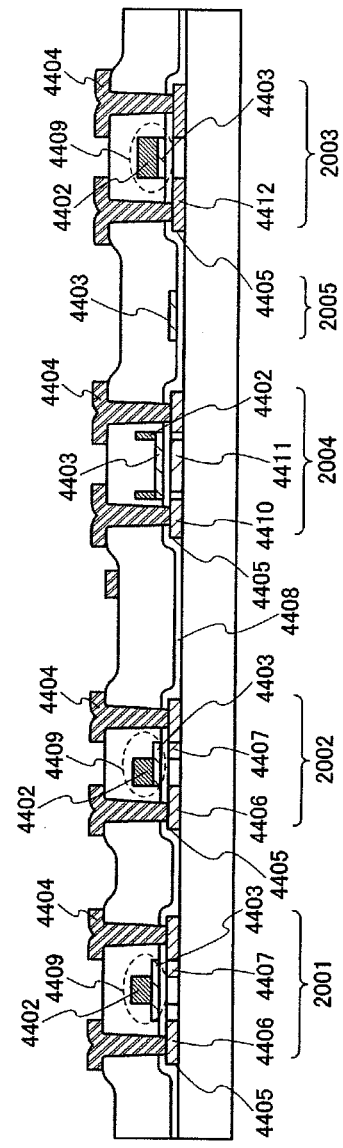
FIG. 20 is a diagram showing Embodiment 3.
Figure 21A:
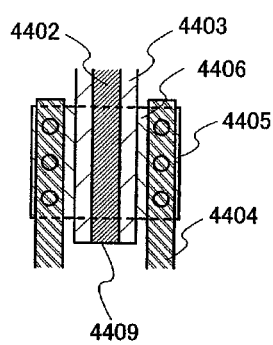
FIGS. 21A to 21E are diagrams showing Embodiment 3.
Figure 21B:
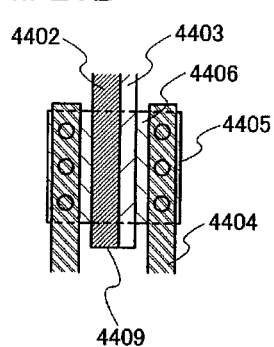
Figure 21C:
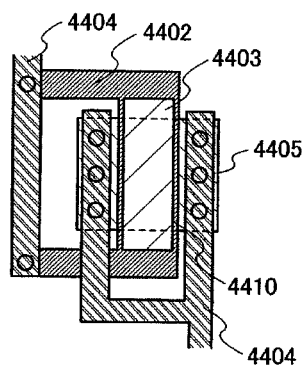
Figure 21D:
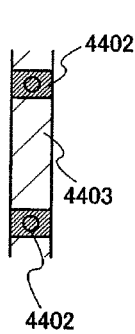
Figure 21E:
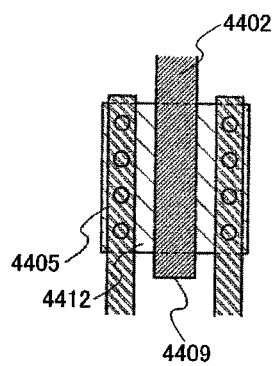

This embodiment shows a structural example of a transistor used in a circuit which constitutes a semiconductor device of the present invention. The transistor may be a MOS transistor formed over a single crystalline substrate, or a thin film transistor (TFT) as well. FIG. 20 shows a cross-sectional structure of such transistors constituting a circuit. FIG. 20 shows an N-channel transistor 2001, an N-channel transistor 2002, a capacitor 2004, a resistor 2005, and a P-channel transistor 2003. Each of the transistors includes a semiconductor layer 4405, a gate insulating layer 4408, and a gate electrode 4409. The gate electrode 4409 has a stacked-layer structure of a first conductive layer 4403 and a second conductive layer 4402. FIG. 21A is a top view corresponding to the N-channel transistor 2001 shown in FIG. 20. FIG. 21B is a top view corresponding to the N-channel transistor 2002 shown in FIG. 20. FIG. 21C is a top view corresponding to the capacitor 2004 shown in FIG. 20. FIG. 21D is a top view corresponding to the resistor 2005 shown in FIG. 20. FIG. 21E is a top view corresponding to the P-channel transistor 2003 shown in FIG. 20. FIGS. 21A to 21E can also be referred to along with FIG. 20.

In FIG. 20, the N-channel transistor 2001 has lightly doped drain (LDD) regions on both sides of a channel forming region in the semiconductor layer 4405. The LDD regions are impurity regions 4407 to which an impurity imparting N-type conductivity is doped at a lower concentration than to a source region and a drain region (impurity regions 4406) which are in contact with wires 4404. In the case of forming the N-channel transistor 2001, the impurity regions 4406 and the impurity regions 4407 are added with an impurity imparting N-type conductivity, such as phosphorus. The LDD regions are formed to suppress hot electron degradation and short channel effects.

As shown in FIG. 21A, in the gate electrode 4409 of the N-channel transistor 2001, the first conductive layer 4403 is provided on both sides of the second conductive layer 4402. In this case, the thickness of the first conductive layer 4403 is smaller than that of the second conductive layer 4402. The first conductive layer 4403 is formed to have such a thickness that ion species accelerated with an electric field of 10 to 100 kV can pass through. The impurity regions 4407 are formed to overlap the first conductive layer 4403 of the gate electrode 4409. In other words, the LDD regions overlapping the gate electrode 4409 are provided. The impurity regions 4407 are formed in a self-alignment manner by adding an impurity of one conductivity type to the semiconductor layer 4405 through the first conductive layer 4403 using the second conductive layer 4402 as a mask. That is, the LDD regions overlapping the gate electrode are formed in a self-alignment manner.

A transistor having LDD regions on both sides of the channel forming region in the semiconductor layer is applied to a transistor constituting a transmission gate (also called an analog switch) or a transistor used in a rectifier circuit in the power supply circuit 503 shown in FIG. 13B. Such a transistor preferably includes LDD regions on both sides of a channel forming region in the semiconductor layer, since positive and negative voltages are applied to source and drain electrodes.

In FIG. 20, the N-channel transistor 2002 has an impurity region 4407 formed on one side of the channel forming region in the semiconductor layer 4405. To the impurity region 4407, an impurity element imparting conductivity is doped at a lower concentration than to the impurity regions 4406. As shown in FIG. 21B, in the gate electrode 4409 of the N-channel transistor 2002, the first conductive layer 4403 is provided on one side of the second conductive layer 4402. In this case also, the LDD region can be formed in a self-alignment manner by adding an impurity of one conductivity type through the first conductive layer 4403 using the second conductive layer 4402 as a mask.

A transistor having an LDD region on one side of a channel forming region in a semiconductor layer may be applied to a transistor in which only one of a positive voltage or a negative voltage is applied between source and drain electrodes. Specifically, the transistor having an LDD region on one side of a channel forming region in the semiconductor layer may be applied to a transistor constituting a logic gate such as an inverter circuit, a NAND circuit, a NOR circuit, and a latch circuit, or a transistor constituting an analog circuit such as a sense amplifier, a constant voltage generating circuit, and a VCO (Voltage Controlled Oscillator).

In FIG. 20, the capacitor 2004 has a structure in which the gate insulating layer 4408 is sandwiched between the first conductive layer 4403 and the semiconductor layer 4405. The semiconductor layer 4405 of the capacitor 2004 includes impurity regions 4410 and an impurity region 4411. The impurity region 4411 is formed in the semiconductor layer 4405 so as to overlap the first conductive layer 4403. The impurity region 4410 is in contact with the wire 4404. Since an impurity of one conductivity type can be added to the impurity region 4411 through the first conductive layer 4403, the impurity region 4410 and the impurity region 4411 may contain the same concentration of impurity or different concentrations of impurity. In any case, the semiconductor layer 4405 of the capacitor 2004 functions as an electrode; therefore, it is preferable that an impurity of one conductivity type be added to the semiconductor layer 4405 to reduce the resistance thereof. The first conductive layer 4403 and the second conductive layer 4402 can effectively function as an electrode by utilizing the second conductive layer 4402 as an auxiliary electrode as shown in FIG. 21C. Such a composite electrode structure combining the first conductive layer 4403 and the second conductive layer 4402 allows the capacitor 2004 to be formed in a self-alignment manner.

The capacitor 2004 can be used as the storage capacitor of the power supply circuit 503, the resonant capacitor 501, or the capacitor of the demodulation circuit 506, which are shown in FIG. 13B. In particular, the resonant capacitor 501 is required to function as a capacitor regardless of a positive or negative voltage applied between two terminals of the capacitor, since both positive and negative voltages are applied between the two terminals of the capacitor.

In FIG. 20, the resistor 2005 includes the first conductive layer 4403 (see also FIG. 21D). The first conductive layer 4403 is formed to have a thickness of approximately 30 to 150 nm; therefore, the resistor can be formed by appropriately setting the width and length thereof.

The resistor can be used as the resistance load of the modulation circuit 507 shown in FIG. 13B, as well as the resistor of the demodulation circuit 506 shown in FIG. 13B. Further, the resistor can be used as the load in the case of controlling a current by a VCO or the like. The resistor may be formed of a semiconductor layer containing a high concentration of an impurity element, or a thin metal layer. While the resistance of a semiconductor layer depends on the film thickness, film quality, impurity concentration, activation rate, and the like; the resistance of a metal layer is determined by the film thickness and film quality and has few variations, which is preferable.

In FIG. 20, the P-channel transistor 2003 includes the semiconductor layer 4405 provided with impurity regions 4412. The impurity regions 4412 function as source and drain regions which are in contact with the wire 4404. The gate electrode 4409 has a structure in which the first conductive layer 4403 and the second conductive layer 4402 overlap each other (see also FIG. 21E). The P-channel transistor 2003 is a transistor with a single drain structure in which an LDD region is not provided. When the P-channel transistor 2003 is formed, an impurity which imparts P-type conductivity, such as boron, is added to the impurity region 4412. On the other hand, when phosphorus is added to the impurity region 4412, an N-channel transistor with a single drain structure can be obtained.

One or both of the semiconductor layer 4405 and the gate insulating layer 4408 may be oxidized or nitrided by high density plasma treatment. This treatment can be performed in a similar manner to that described in Embodiment 1.

According to the aforementioned treatment, the defect level in the interface between the semiconductor layer 4405 and the gate insulating layer 4408 can be reduced. When this treatment is applied to the gate insulating layer 4408, the gate insulating layer 4408 can be densified. In other words, generation of charged defects can be suppressed, and variations in threshold voltage of the transistor can be suppressed. When the transistor is driven with a voltage of 3 V or lower, an insulating layer which is oxidized or nitrided by the plasma treatment can be used as the gate insulating layer 4408. If the driving voltage of the transistor is 3 V or higher, the gate insulating layer 4408 can be formed by combining an insulating layer formed over the surface of the semiconductor layer 4405 by the plasma treatment and an insulating layer deposited by a CVD method (a plasma CVD method or a thermal CVD method). In addition, the insulating layer may also be used as a dielectric layer of the capacitor 2004. In this case, the insulating layer formed by the plasma treatment is a dense film with a thickness of 1 to 10 nm; therefore, the capacitor 2004 with large charge capacity can be obtained.

As described with reference to FIGS. 20 to 21E, the elements with various structures can be formed by combining conductive layers with different thicknesses. A region where only the first conductive layer is formed and a region where the first conductive layer and the second conductive layer are stacked can be formed using a photomask or a reticle provided with a diffraction grating pattern or an auxiliary pattern having an optical intensity reducing function formed of a semitransparent film. That is, in a photolithography process, the quantity of transmitting light of the photomask is controlled in exposing the photoresist so that the thickness of a resist mask to be developed is changed. In this case, a slit at the resolution limit or less may be provided in the photomask or the reticle to form the above-described resist having the complex shape. In addition, by baking at about 200° C. after developing, a mask pattern made from a photoresist material can be changed in shape.

In addition, by using the photomask or the reticle which is provided with a diffraction grating pattern or an auxiliary pattern having an optical intensity reducing function formed of a semitransparent film, the region where only the first conductive layer is formed and the region where the first conductive layer and the second conductive layer are stacked can be formed in succession. As shown in FIG. 21A, the region where only the first conductive layer is formed can be formed selectively over the semiconductor layer. Such a region is effective over the semiconductor layer, but is not required in the other region (a wire region which is successive to the gate electrode). Since the region where only the first conductive layer is formed is not required to be formed in the wire portion by using this photomask or reticle, wire density can be improved substantially.

In the case of FIGS. 20 to 21E, the first conductive layer is formed to have a thickness of 30 to 50 nm using a high melting point metal such as tungsten (W), chromium (Cr), tantalum (Ta), tantalum nitride, or molybdenum (Mo), or an alloy or a compound containing the high melting point metal as its main component. In addition, the second conductive layer is formed to have a thickness of 300 to 600 nm using a high melting point metal such as tungsten (W), chromium (Cr), tantalum (Ta), tantalum nitride, or molybdenum (Mo), or an alloy or a compound containing the high melting point metal as its main component. For example, the first conductive layer and the second conductive layer are made of different conductive materials so as to have a difference in etching rate in the subsequent etching step. The first conductive layer and the second conductive layer may be made of, for example, tantalum nitride and tungsten, respectively.

According to the description of this embodiment, transistors having different electrode structures, a capacitor, and a resistor can be formed separately with the same process by using the photomask or the reticle which is provided with a diffraction grating pattern or an auxiliary pattern having an optical intensity reducing function formed of a semitransparent film. Accordingly, in response to circuit characteristics, elements having different modes can be formed without increasing the number of steps and integrated.

This embodiment can be implemented freely combining with the aforementioned embodiment modes and Embodiments 1 and 2.

Embodiment 4

In this embodiment, an example of a static RAM (an SRAM) which can be used as a memory (the memory circuit 305 in FIG. 13B, and the like) of the semiconductor device of the present invention is described with reference to FIGS. 22A to 24B.

Figure 22A:
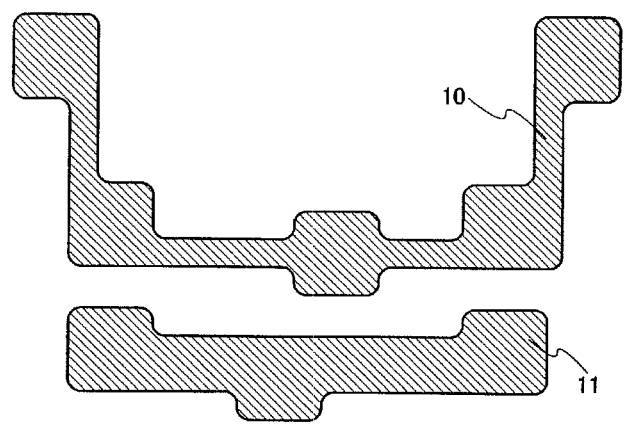
FIGS. 22A and 22B are diagrams showing Embodiment 4.

A semiconductor layer 10 and a semiconductor layer 11 shown in FIG. 22A are preferably made of silicon or a crystalline semiconductor containing silicon. For example, the semiconductor layer 10 and the semiconductor layer 11 are made of polycrystalline silicon, single crystalline silicon, or the like which is obtained by crystallizing a silicon film by laser annealing or the like. Furthermore, a metal oxide semiconductor, amorphous silicon, or an organic semiconductor, which has semiconductor characteristics, may also be employed.

In any case, a semiconductor layer formed first is provided over the entire surface or a part (region with a larger area than that determined as a semiconductor region of a transistor) of a substrate having an insulating surface. Then, a mask pattern is formed over the semiconductor layer by photolithography. The mask pattern is used for etching the semiconductor layer, thereby forming the semiconductor layer 10 and the semiconductor layer 11 having specific island shapes, which include a source region, a drain region, and a channel forming region of a transistor. The shapes of the semiconductor layer 10 and the semiconductor layer 11 are determined, considering the adequacy of layout.

Figure 22B:
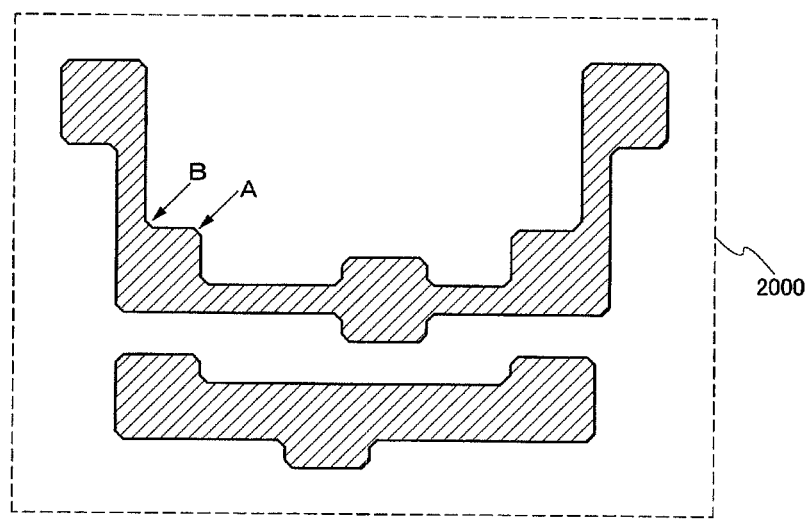

The photomask for forming the semiconductor layer 10 and the semiconductor layer 11 shown in FIG. 22A has a mask pattern 2000 shown in FIG. 22B. The mask pattern 2000 is different depending on whether a resist used in a photolithography process is a positive type or a negative type. In the case of using the positive type resist, the mask pattern 2000 shown in FIG. 22B is manufactured as a light shielding portion. The mask pattern 2000 has a shape in which a convex portion A of a polygon is chamfered. In addition, a concave portion B is bent so as not to be right angles.

The shape of the mask pattern 2000 shown in FIG. 22B is reflected in the semiconductor layer 10 and the semiconductor layer 11 shown in FIG. 22A. In that case, the shape similar to the mask pattern 2000 may be transferred, and the transfer may be conducted so that the corner (convex portion or concave portion) of the mask pattern 2000 is further rounded. In other words, a round portion in which the pattern shape is smoother than the mask pattern 2000 may be provided.

An insulating layer which contains silicon oxide or silicon nitride at least partially is formed over the semiconductor layer 10 and the semiconductor layer 11. One of the objects for forming this insulating layer is a gate insulating layer.

Figure 23A:
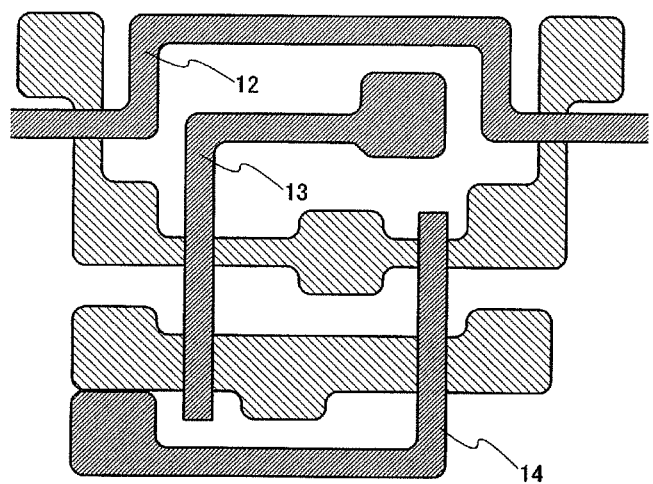
FIGS. 23A and 23B are diagrams showing Embodiment 4.

Then, as shown in FIG. 23A, a gate wire 12, a gate wire 13, and a gate wire 14 are formed so as to overlap the semiconductor layer partially. The gate wire 12 is formed corresponding to the semiconductor layer 10, the gate wire 13 is formed corresponding to the semiconductor layer 10 and the semiconductor layer 11, and the gate wire 14 is formed corresponding to the semiconductor layer 10 and the semiconductor layer 11. In order to obtain the gate wires, a metal layer or a semiconductor layer having high conductivity is deposited over the insulating layer and processed into a desired shape by photolithography.

Figure 23B:
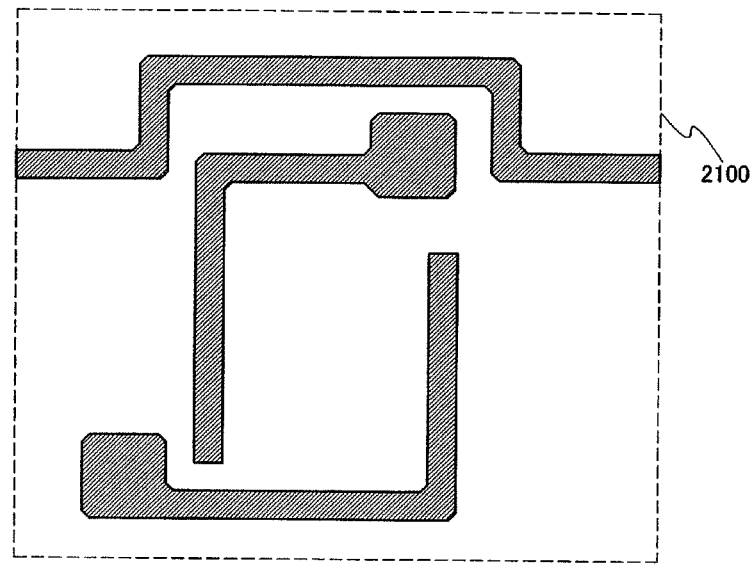

The photomask for forming the gate wires has a mask pattern 2100 shown in FIG. 23B. The corner of the mask pattern 2100 is bent so as not to be right angles. The shape of the mask pattern 2100 shown in FIG. 23B is reflected in the gate wire 12, the gate wire 13, and the gate wire 14 shown in FIG. 23A. In that case, the shape similar to the mask pattern 2100 may be transferred, and the transfer may be conducted so that the corner of the mask pattern 2100 is further rounded. In other words, a round portion in which the pattern shape is smoother than the mask pattern 2100 may be provided. The corner is rounded, so that the bent convex portion has an effect that the generation of fine powder due to abnormal discharge can be suppressed in dry etching using plasma, and the bend concave portion has an effect that even if fine powder which easily gathers in the corner is generated, it can be washed away in cleaning. As a result, improvement in yield can be greatly expected.

An interlayer insulating layer is formed after the gate wire 12, the gate wire 13, and the gate wire 14. The interlayer insulating layer is made of an inorganic insulating material such as silicon oxide, or an organic insulating material using polyimide, an acrylic resin, or the like. An insulating layer made of silicon nitride, silicon nitride oxide, or the like may be formed between the interlayer insulating layer and the gate wire 12, the gate wire 13, and the gate wire 14. In addition, an insulating layer made of silicon nitride, silicon nitride oxide, or the like may be formed over the interlayer insulating layer. Such an insulating layer can prevent the semiconductor layer and the gate insulating layer from being contaminated with impurities such as extrinsic metal ion and moisture, which may adversely affect a transistor.

Figure 24A:
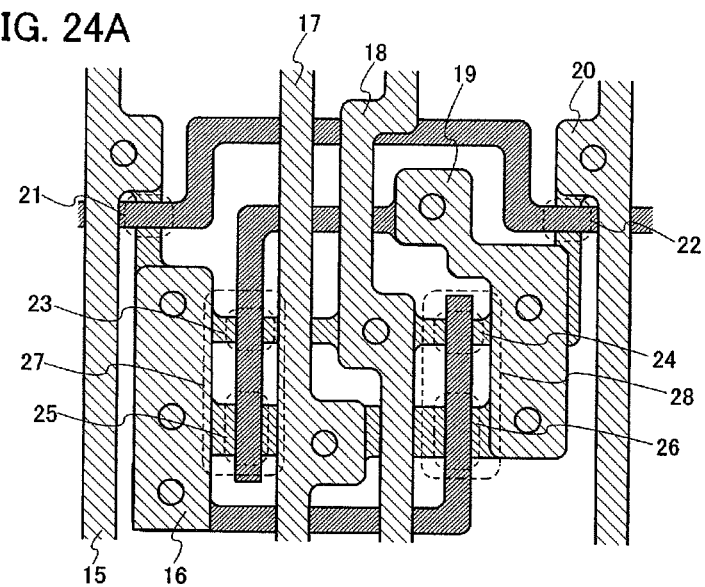
FIGS. 24A and 24B are diagrams showing Embodiment 4.

In the interlayer insulating layer, an opening is formed at a predetermined position. For example, the opening is provided corresponding to the gate wire or semiconductor layer in the lower layer. A wire layer formed of one layer or a plurality of layers of metal or a metal compound is processed into a predetermined pattern by etching using a mask pattern which is formed by photolithography. Then, as shown in FIG. 24A, a wire 15, a wire 16, a wire 17, a wire 18, a wire 19, and a wire 20 are formed so as to partially overlap the semiconductor layer 10 and the semiconductor layer 11. Each of the wires connects particular elements. Each of the wires connects particular elements not with a straight line but with a line including a bend portion because of layout limitations. In addition, the wire width changes in a contact portion or in other regions. The wire width increases in a contact portion if the size of a contact hole is equal to or larger than the wire width.

Figure 24B:
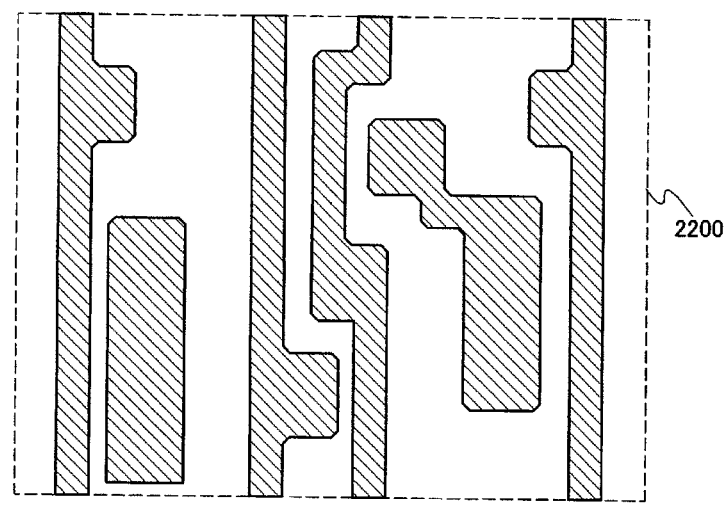

A photomask for forming the wires 15 to 20 has a mask pattern 2200 shown in FIG. 24B. This mast pattern 2200 is bent so as not to be right angles. In this manner, the corner may be rounded. The bent convex portion of such a wire has an effect that the generation of fine powder due to abnormal discharge can be suppressed in dry etching using plasma, and the bend concave portion of the wire has an effect that even if fine powder which easily gathers in the corner is generated, it can be washed away in cleaning. As a result, improvement in the yield can be expected. Furthermore, the wire with a rounded corner allows electrical conduction of wires. In addition, in the case where a plurality of wires including a portion of which bent portion or width changes are provided in parallel, the use of a wire with a rounded corner is highly advantageous since dust or the like are easily gathered particular when the corner of the wire has right angles.

FIG. 24A shows an N-channel transistor 21, an N-channel transistor 22, an N-channel transistor 23, an N-channel transistor 24, a P-channel transistor 25, and a P-channel transistor 26. The N-channel transistor 23 and the P-channel transistor 25 constitute an inverter 27. The N-channel transistor 24 and the P-channel transistor 26 constitute an inverter 28. A circuit including these six transistors constitutes an SRAM. An insulating layer made of silicon nitride, silicon oxide, or the like may be formed over these transistors.

This embodiment can be implemented freely combining with the aforementioned embodiment modes and Embodiments 1 to 3.

Embodiment 5

Figure 25A:
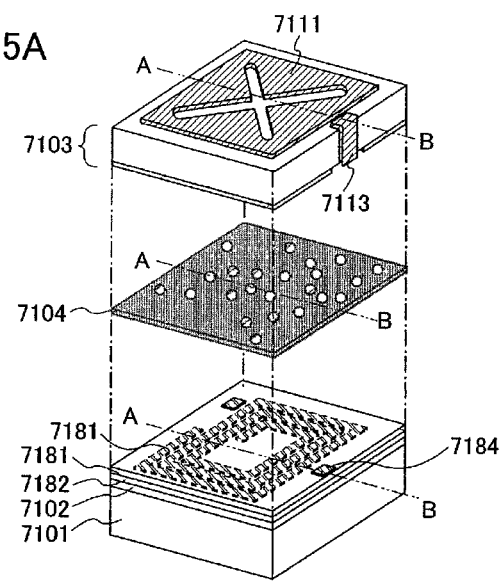
FIGS. 25A and 25B are diagrams showing Embodiment 5.
Figure 25B:
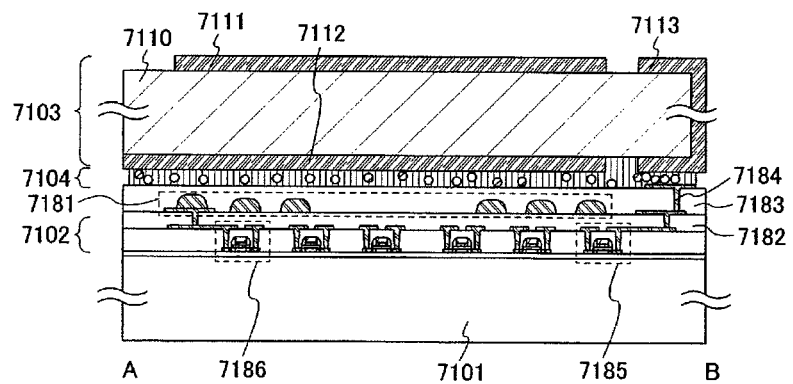

One embodiment of a semiconductor device of the present invention is shown in FIGS. 25A and 25B. FIG. 25A is a development view of the semiconductor device, and FIG. 25B is a cross-sectional view along a line A-B of FIG. 25A. Described in this embodiment is a structure of the semiconductor device including a plurality of antennas, particularly the semiconductor device including an antenna and a patch antenna which are formed over a layer having a thin film transistor.

Similarly to the method for manufacturing the element group 601 described in Embodiment 1, a layer 7102 including thin film transistors is formed over an insulating substrate 7101. An interlayer insulating layer 7182 is formed over the layer 7102 including thin film transistors. A first antenna 7181 is formed over the interlayer insulating layer 7182. An insulating layer 7183 is formed over the first antenna 7181, and a connecting terminal 7184 is formed on the surface of the insulating layer 7183.

The insulating layer 7183, in a part of which the connecting terminal 7184 is exposed, is attached to a patch antenna 7103 which is a second antenna with an anisotropic conductive adhesive 7104. The connecting terminal 7184 is electrically connected to a power feeding layer 7113 of the patch antenna with conductive particles dispersed in the anisotropic conductive adhesive. The connecting terminal 7184 is also electrically connected to a first thin film transistor 7185 which is formed in the layer 7102 including thin film transistors. Furthermore, the first antenna 7181 is connected to a second thin film transistor 7186 which is formed in the layer 7102 including thin film transistors. Note that a conductive layer which is obtained by curing a conductive paste may be used instead of the anisotropic conductive adhesive.

The first antenna 7181 is made of a metal material containing aluminum, copper, or silver. For example, composition of copper or silver paste can be formed by a printing method such as screen printing, offset printing, or ink-jet printing. Alternatively, an aluminum film may be formed by sputtering or the like, and processed by etching. The first antenna 7181 may also be formed by an electrolytic plating method or an electroless plating method.

Note that the first antenna 7181 can be omitted.

Figure 26A:
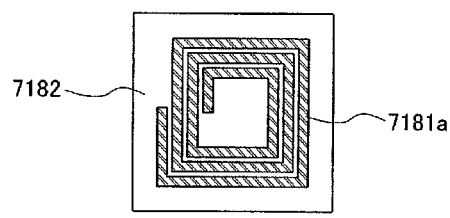
FIGS. 26A to 26C are diagrams showing Embodiment 5.

Here, the first antenna 7181 has a square coil shape as shown in FIG. 26A.

Figure 26B:
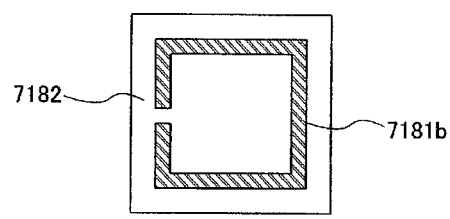
Figure 26C:
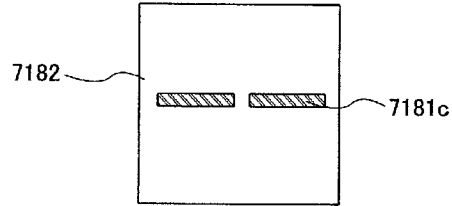

The shape of the first antenna 7181 is described with reference to FIGS. 26A to 26C. FIGS. 26A to 26C are top views showing the interlayer insulating layer 7182 and an antenna formed thereover. Although the first antenna 7181 has a square coil shape 7181$a$ as shown in FIGS. 25A and 26A in this embodiment, the shape is not limited to this. The antenna may have a circular coil shape. Alternatively, as shown in FIG. 26B, the antenna may have a square loop shape 7181$b$. The antenna may also have a circular loop shape. Furthermore, as shown in FIG. 26C, the antenna may have a linear-dipole shape 7181$c$. Moreover, the antenna may also have a curved-dipole shape.

By thus providing a plurality of antennas, a multiband semiconductor device capable of receiving electric waves with different frequencies in one semiconductor can be formed.

This embodiment can be implemented freely combining with the aforementioned embodiment modes and Embodiments 1 to 4.

Embodiment 6

In this embodiment, applications of a semiconductor device of the present invention (corresponding to the wireless tag 200 in FIG. 13A) are described with reference to FIGS. 18A to 19E. The wireless tag 200 can be incorporated in, for example, bills, coins, securities, bearer bonds, certificates (driving license, resident card, and the like, see FIG. 19A), containers for wrapping objects (wrapping paper, bottle, and the like, see FIG. 19B), recording media such as DVD software, CDs, and video tapes (see FIG. 19C), vehicles such as cars, motorbikes, and bicycles (see FIG. 19D), personal belongings such as bags and glasses (see FIG. 19E), foods, clothes, commodities, electronic apparatuses, and the like. The electronic apparatuses include a liquid crystal display device, an EL (electroluminescence) display device, a television set (also simply called a television or a television receiver), a mobile phone set, and the like.

The wireless tag 200 can be fixed to an object by being attached to the surface of the object or embedded in the object. For example, the wireless tag 200 may be embedded in paper of a book, or organic resin of a package. When the wireless tag 200 is incorporated in bills, coins, securities, bearer bonds, certificates, and the like, forgery thereof can be prevented. Furthermore, when the wireless tag 200 is incorporated in containers for wrapping objects, recording media, personal belongings, foods, clothes, commodities, electronic apparatuses, and the like, an inspection system, a rental system, and the like can be performed more efficiently. The wireless tag 200 can also prevent vehicles from being forged or stolen. In addition, when the wireless tag 200 is implanted into creatures such as animals, each creature can be identified easily. For example, when the wireless tag is implanted into creatures such as domestic animals, the year of birth, sex, breed, and the like thereof can be identified easily.

As described above, the wireless tag 200 of the present invention can be incorporated in any object (including creatures).

The wireless tag 200 has various advantages such that data can be transmitted and received by wireless communication, the wireless tag can be processed into various shapes, and wide directivity and recognition range are achieved depending on a selected frequency.

Next, one mode of a system using the wireless tag 200 is described with reference to FIGS. 18A to 18C. A reader/writer 9520 (corresponding to the reader/writer 201 in FIG. 13A) is provided on a side of a portable terminal including a display portion 9521. A semiconductor device 9523 of the present invention (corresponding to the wireless tag 200 in FIG. 13A) is provided on a side of an object A 9522, and a semiconductor device 9531 of the present invention is provided on a top surface of an object B 9532 (see FIG. 18A). When the reader/writer 9520 is brought close to the semiconductor device 9523 included in the object A 9522, information on the object A 9522, such as ingredients, place of origin, test result in each production step, history of the distribution process, and explanation of the object is displayed on the display portion 9521. When the reader/writer 9520 is brought close to the semiconductor device 9531 included in the object B 9532, information on the object B 9532, such as ingredients, place of origin, test result in each production step, history of the distribution process, and explanation of the object is displayed on the display portion 9521.

Figure 18A:
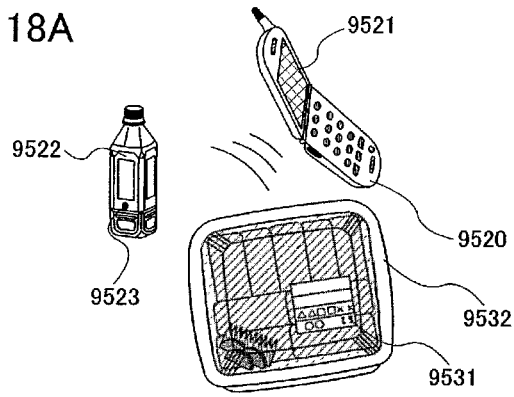
FIGS. 18A to 18C are diagrams showing Embodiment 6.
Figure 18B:
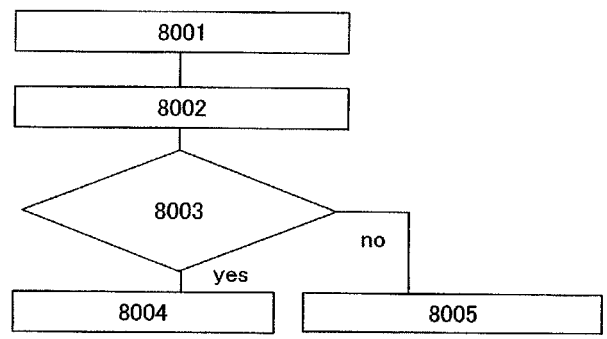

An example of a business model utilizing the system shown in FIG. 18A is described with reference to a flow chart shown in FIG. 18B. Information on allergy is inputted to a portable terminal (a first step 8001). The information on allergy is information on medical products, their components, or the like which may cause allergic reactions to certain people. As described above, information on the object A 9522 is obtained by the reader/writer 9520 incorporated in the portable terminal (a second step 8002). Here, the object A 9522 is a medical product. The information on the object A 9522 includes information on the components or the like of the object A 9522. The information on allergy is compared to the obtained information on components or the like of the object A 9522, thereby determining whether corresponding components are contained (a third step 8003). If the corresponding components are contained, the user of the portable terminal is alerted that certain people may have allergic reactions to the object A (a fourth step 8004). If the corresponding components are not contained, the user of the portable terminal is informed that certain people are at low risk of having allergic reactions to the object A (the fact that the object A is safe) (a fifth step 8005). In the fourth step 8004 and the fifth step 8005, in order to inform the user of the portable terminal, the information may be displayed on the display portion 9521 of the portable terminal, or an alarm of the portable terminal or the like may be sounded.

Figure 18C:
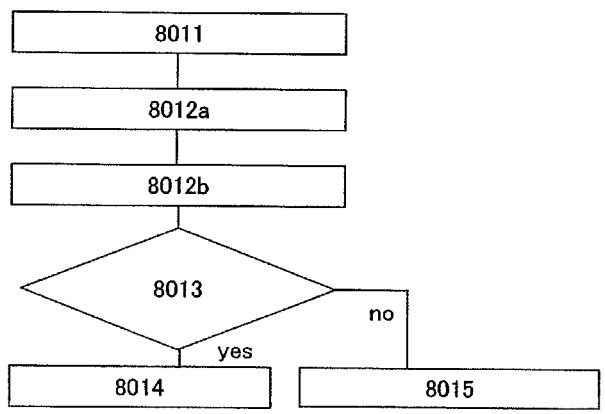
Figure 19A:
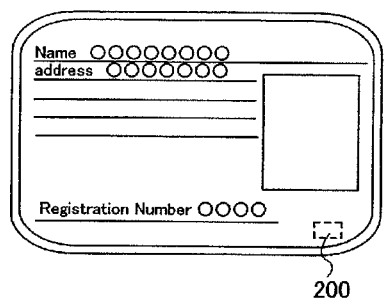
FIGS. 19A to 19E are diagrams showing Embodiment 6.
Figure 19B:
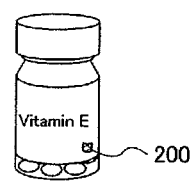
Figure 19C:
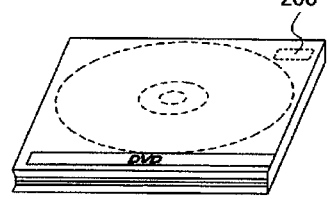
Figure 19D:
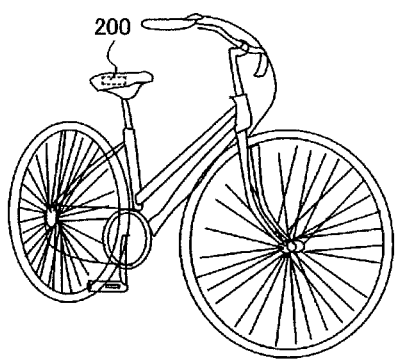
Figure 19E:
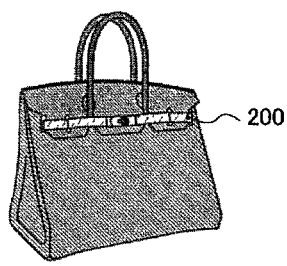

Alternatively, FIG. 18C shows another example of a business model. Information on combinations of medical products which are dangerous when used at the same time or combinations of components of medical products which are dangerous when used at the same time (hereinafter referred to simply as combination information) is inputted to a terminal (a first step 8011). As described above, information on the object A is obtained by the reader/writer incorporated in the terminal (a second step 8012a). Here, the object A is a medical product. The information on the object A includes information on components or the like of the object A. Next, as described above, information on the object B is obtained by the reader/writer incorporated in the terminal (a third step 8012b). Here, the object B is also a medical product. The information on the object B includes information on components or the like of the object B. In this way, information of a plurality of medical products is obtained. The combination information is compared to the obtained information of a plurality of objects, thereby determining whether a corresponding combination of medical products which are dangerous when used at the same time is contained (a fourth step 8013). If the corresponding combination is contained, the user of the terminal is alerted (a fifth step 8014). If the corresponding combination is not contained, the user of the terminal is informed of the safety (a sixth step 8015). In the fifth step and the sixth step, in order to inform the user of the terminal, the information may be displayed on the display portion of the terminal, or an alarm of the portable terminal or the like may be sounded.

As described above, by utilizing a semiconductor device of the present invention for a system, information can be obtained easily, and a system which realizes high performance and high added values can be provided.

This embodiment can be implemented freely combining with the aforementioned embodiment modes and Embodiments 1 to 5.

This application is based on Japanese Patent Application serial No. 2005-273356 field in Japan Patent Office on Sep. 21, 2005, the entire contents of which are hereby incorporated by reference.

EXPLANATION OF REFERENCE

10: semiconductor layer, 11: semiconductor layer, 12: gate wire, 13: gate wire, 14: gate wire, 15: wire, 16: wire, 17: wire, 18: wire, 19: wire, 20: wire, 21: transistor, 22: transistor, 23: transistor, 24: transistor, 25: transistor, 26: transistor, 27: inverter, 28: inverter, 101: switching circuit, 102: output, 103: output, 104: output, 105: determination circuit, 106: output, 111: EXOR, 112: selector, 131: data signal, 132: select signal, 144: signal, 145: output control circuit, 146: output control signal, 147: EXNOR, 148: AND, 149a: first NAND, 149b: second NAND, 150: NOR, 151: output, 152: clock signal, 153: input signal, 154: shift register reset signal, 171: output reset signal, 181: clock signal, 182: data signal, 190: modulated carrier wave, 191: DC voltage, 192: decision result, 193: unique identifier, 200: wireless tag, 201: reader/writer, 202: antenna, 203: circuit portion, 204: analog portion, 205: digital portion, 206: antenna, 207: circuit portion, 301: code extraction circuit, 302: code determination circuit, 303: cyclic redundancy check circuit, 304: control circuit, 305: memory circuit, 501: resonant capacitor, 502: band-pass filter, 503: power supply circuit, 506: demodulation circuit, 507: modulation circuit, 600: substrate, 601: element group, 602: terminal portion, 603: conductive particle, 604: resin, 610: substrate, 661: base layer, 662: semiconductor layer, 662a: channel forming region, 662b: impurity region, 662c: low concentration impurity region, 663: first insulating layer, 664: gate electrode, 665: third insulating layer, 666: wire, 667: second insulating layer, 668: fourth insulating layer, 701: flexible substrate, 901: protective layer, 902: antenna, 903: protective layer, 904: element group, 905: one of source and drain, 906: the other of source and drain, 907: gate electrode, 980: substrate, 981: transistor, 1201a: corner, 1201b: corner, 1201c: corner, 1202a: corner, 1202b: corner, 1202c: corner, 2000: mask pattern, 2001: transistor, 2002: transistor, 2003: transistor, 2004: capacitor, 2005: resistor, 2100: mask pattern, 2200: mask pattern, 3003: thickness, 3004: direction, 3005: direction, 3011: wire, 3012: wire, 3013: wire, 3014: contact hole, 4402: second conductive layer, 4403: first conductive layer, 4404: wire, 4405: semiconductor layer, 4406: impurity region, 4407: impurity region, 4408: gate insulating layer, 4409: gate electrode, 4410: impurity region, 4411: impurity region, 4412: impurity region, 7101: insulating substrate, 7102: layer, 7103: patch antenna, 7104: anisotropic conductive adhesive, 7113: power feeding layer, 7181: first antenna, 7181a: square coil shape, 7181b: square loop shape, 7181c: linear-dipole shape, 7182: interlayer insulating layer, 7183: insulating layer, 7184: connecting terminal, 7185: first thin film transistor, 7186: second thin film transistor, 8001: first step, 8002: second step, 8003: third step, 8004: fourth step, 8005: fifth step, 8011: first step, 8012a: second step, 8012b: third step, 8013: fourth step, 8014: fifth step, 8015: sixth step, 9520: reader/writer, 9521: display portion, 9522: object A, 9523: semiconductor device, 9531: semiconductor device, and 9532: object B.

What is claimed is:

1. A semiconductor device comprising:
   an antenna; and
   a circuit portion configured to transmit a signal to the antenna and to receive a signal from the antenna, the circuit portion comprising a cyclic redundancy check circuit and a memory circuit, the memory circuit comprising:
   a first transistor;
   a first invertor comprising a second transistor and a third transistor, and a second invertor comprising a fourth transistor and a fifth transistor, each of the first invertor and the second invertor being electrically connected to the first transistor; and
   a sixth transistor electrically connected to the first invertor and the second invertor,
   wherein at least one of the first to sixth transistors comprises a semiconductor layer comprising a channel forming region, and wherein the channel forming region comprises a metal oxide semiconductor.

2. The semiconductor device according to claim 1, wherein the memory circuit is an SRAM.

3. The semiconductor device according to claim 1, wherein the cyclic redundancy check circuit comprises:
   a first shift register to a p-th (p is a natural number greater than 1) shift register which each have one stage or a plurality of stages connected in cascade, and in which an inputted signal is delayed and then outputted from the one stage or the plurality of stages, and in which the output from the one stage or the plurality of stages is performed in synchronization with a clock signal;
   a first exclusive OR circuit to a (p−1)th exclusive OR circuit each calculating an exclusive OR of two inputted signals; and
   a switching circuit to which a data signal, a select signal, and an output of a last stage of the p-th shift register are inputted, and which switches one of a first signal or a second signal to be outputted in response to the select signal,
   wherein an output of the switching circuit is inputted to a first stage of the first shift register,
   wherein an output of a last stage of an r-th (r is a natural number smaller than p) shift register, and the output of the switching circuit are inputted to an r-th exclusive OR circuit, and an output of the r-th exclusive OR circuit is inputted to a first stage of a (r+1)th shift register,
   wherein the first signal is an exclusive OR of the data signal and the output of the last stage of the p-th shift register, and
   wherein the second signal is a logical value of "0".

4. A semiconductor device comprising:
   an antenna; and
   a circuit portion configured to transmit a signal to the antenna and to receive a signal from the antenna, the circuit portion comprising a power supply circuit, a demodulation circuit, a modulation circuit, a cyclic redundancy check circuit and a memory circuit, the memory circuit comprising:
   a first transistor;
   a first invertor comprising a second transistor and a third transistor, and a second invertor comprising a fourth transistor and a fifth transistor, each of the first invertor and the second invertor being electrically connected to the first transistor; and
   a sixth transistor electrically connected to the first invertor and the second invertor,
   wherein at least one of the first to sixth transistors comprises a semiconductor layer comprising a channel forming region, and wherein the channel forming region comprises a metal oxide semiconductor.

5. The semiconductor device according to claim 4, wherein the memory circuit is an SRAM.

6. The semiconductor device according to claim 4, wherein the cyclic redundancy check circuit comprises:
   a first shift register to a p-th (p is a natural number greater than 1) shift register which each have one stage or a plurality of stages connected in cascade, and in which an inputted signal is delayed and then outputted from the one stage or the plurality of stages, and in which the output from the one stage or the plurality of stages is performed in synchronization with a clock signal;
   a first exclusive OR circuit to a (p−1)th exclusive OR circuit each calculating an exclusive OR of two inputted signals; and
   a switching circuit to which a data signal, a select signal, and an output of a last stage of the p-th shift register are inputted, and which switches one of a first signal or a second signal to be outputted in response to the select signal,
   wherein an output of the switching circuit is inputted to a first stage of the first shift register,
   wherein an output of a last stage of an r-th (r is a natural number smaller than p) shift register, and the output of the switching circuit are inputted to an r-th exclusive OR circuit, and an output of the r-th exclusive OR circuit is inputted to a first stage of a (r+1)th shift register,
   wherein the first signal is an exclusive OR of the data signal and the output of the last stage of the p-th shift register, and
   wherein the second signal is a logical value of "0".

7. A semiconductor device comprising:
   an antenna configured to receive a carrier wave;
   a pass-band filter configured to remove a noise from the carrier wave;
   a demodulation circuit configured to demodulate the carrier wave passed through the pass-band filter;
   a power supply circuit configured to generate a direct voltage by using the carrier wave passed through the pass-band filter;
   a code extraction circuit configured to extract a code of a signal of the carrier wave demodulated by the demodulation circuit;
   a code determination circuit configured to analyze the code from the code extraction circuit;
   a cyclic redundancy check circuit configured to calculate a CRC code corresponding to a transmitting data signal;
   a control circuit configured to add the CRC code to the transmitting data signal;
   a memory circuit configured to output a stored unique identifier to the control circuit, the memory circuit comprising:
   a first transistor;
   a first invertor comprising a second transistor and a third transistor, and a second invertor comprising a fourth transistor and a fifth transistor, each of the first invertor and the second invertor being electrically connected to the first transistor; and
   a sixth transistor electrically connected to the first invertor and the second invertor, and a modulation circuit configured to load-modulate the carrier wave in accordance with a signal from the control circuit, wherein at least one of the first to sixth transistors comprises a semiconductor layer comprising a channel forming region, and wherein the channel forming region comprises a metal oxide semiconductor.

8. The semiconductor device according to claim 7, wherein the memory circuit is an SRAM.

9. The semiconductor device according to claim 7, wherein the cyclic redundancy check circuit comprises:

a first shift register to a p-th (p is a natural number greater than 1) shift register which each have one stage or a plurality of stages connected in cascade, and in which an inputted signal is delayed and then outputted from the one stage or the plurality of stages, and in which the output from the one stage or the plurality of stages is performed in synchronization with a clock signal;

a first exclusive OR circuit to a (p−1)th exclusive OR circuit each calculating an exclusive OR of two inputted signals; and a switching circuit to which a data signal, a select signal, and an output of a last stage of the p-th shift register are inputted, and which switches one of a first signal or a second signal to be outputted in response to the select signal, wherein an output of the switching circuit is inputted to a first stage of the first shift register, wherein an output of a last stage of an r-th (r is a natural number smaller than p) shift register, and the output of the switching circuit are inputted to an r-th exclusive OR circuit, and an output of the r-th exclusive OR circuit is inputted to a first stage of a (r+1)th shift register, wherein the first signal is an exclusive OR of the data signal and the output of the last stage of the p-th shift register, and wherein the second signal is a logical value of "0".

* * * * *